US009500718B2

(12) United States Patent
Kondo

(10) Patent No.: US 9,500,718 B2
(45) Date of Patent: Nov. 22, 2016

(54) LOAD TESTING APPARATUS

(71) Applicant: TATSUMI RYOKI CO., LTD, Tokyo (JP)

(72) Inventor: Toyoshi Kondo, Tokyo (JP)

(73) Assignee: TATSUMI RYOKI CO., LTD, Tokyo (JP)

( * ) Notice: Subject to any disclaimer, the term of this patent is extended or adjusted under 35 U.S.C. 154(b) by 0 days.

(21) Appl. No.: 15/185,553

(22) Filed: Jun. 17, 2016

(65) Prior Publication Data
US 2016/0299198 A1 Oct. 13, 2016

Related U.S. Application Data

(63) Continuation of application No. PCT/JP2014/004062, filed on Aug. 4, 2014, which is a continuation of application No. PCT/JP2014/000944, filed on Feb. 24, 2014.

(51) Int. Cl.
G01R 31/40 (2014.01)
G01R 1/04 (2006.01)
H01C 13/02 (2006.01)

(52) U.S. Cl.
CPC ............. G01R 31/40 (2013.01); G01R 1/04 (2013.01); H01C 13/02 (2013.01)

(58) Field of Classification Search
CPC . G01R 31/40; G01R 31/31721; G01R 31/42
USPC .................................................. 324/764.01
See application file for complete search history.

(56) References Cited

U.S. PATENT DOCUMENTS

2016/0252579 A1* 9/2016 Kondo ................... G01R 31/40

FOREIGN PATENT DOCUMENTS

| JP | H06-034725 A | 2/1994 |
| JP | H11-026820 A | 1/1999 |
| JP | 2000-121709 A | 4/2000 |
| JP | 2010-025752 A | 2/2010 |

OTHER PUBLICATIONS

International Search Report issued in PCT/JP2014/004062, mailed on Oct. 21, 2014, with translation (5 pages).
Written Opinion of the International Searching Authority issued in PCT/JP2014/004062, mailed on Oct. 21, 2014, with translation (6 pages).
IEC 61936-1 issued Aug. 2010 (214 pages).

* cited by examiner

Primary Examiner — Thomas Valone
(74) Attorney, Agent, or Firm — Nakanishi IP Associates, LLC

(57) ABSTRACT

A load testing apparatus includes at least two resistance units each configured with a plurality of resistor-groups arranged in stages along z direction, which is a vertical direction, and including a frame configured with an insulating material covering a side face of the resistor-groups, each of the resistor-groups including resistors arrayed along a horizontal direction; and at least two base parts each including a cooling fan and provided separately. At least one of the resistance units are provided on a top of each of the base parts via an insulator. A face of the frame that at least faces another adjacent resistance unit is positioned in an inner side of a side face of the base part, on which the resistance unit is provided, by a first distance when viewed from above. The at least two resistance units are disposed to have a gap between the frames of adjacent resistance units, the gap being equal to or larger than a second distance to provide insulation between the adjacent resistance units. The second distance is twice the first distance. The first distance is equal to or larger than 45 mm.

12 Claims, 27 Drawing Sheets

LOAD TESTING APPARATUS

CROSS-REFERENCE TO RELATED APPLICATIONS

This application is a continuation application of International Patent Application No. PCT/JP2014/004062 filed on Aug. 4, 2014, which claims priority to International Patent Application No. PCT/JP2014/000944 filed on Feb. 24, 2014, the entire contents of which are incorporated by reference.

TECHNICAL FIELD

The present invention relates to load testing apparatuses used for an electric load test of a power source such as an alternate-current generator.

BACKGROUND ART

A dry load testing apparatus using a resistance unit including an array of resistors is proposed.

CITATION LIST

Patent Literature

Patent Literature 1: JP 2010-25752 A

SUMMARY OF INVENTION

If the voltage for a load test of a power source is high, a large sized load testing apparatus in which a plurality of resistance units is disposed is needed. The large sized load testing apparatus has a base part integrated with a plurality of resistance units mounted on the base part. So that the large sized load testing apparatus needs to be transported with the resistance units and the base part assembled, which makes it difficult to transport the load testing apparatus through a narrow space, such as an elevator.

One or more embodiment of the present invention are directed to a load testing apparatus that is configured with a plurality of resistance units and can be transported and set up easily.

A load testing apparatus according to one or more embodiments of the present invention includes at least two resistance units each configured with a plurality of resistor-groups arranged in stages along z direction, which is a vertical direction, and including a frame configured with an insulating material covering a side face of the resistor-groups, each of the resistor-groups including resistors arrayed along a horizontal direction; and at least two base parts each including a cooling fan and provided separately. At least one of the resistance units are provided on a top of each of the base parts via an insulator. A face of the frame that at least faces another adjacent resistance unit is positioned in an inner side of a side face of the base part, on which the resistance unit is provided, by a first distance when viewed from above. The at least two resistance units are disposed to have a gap between the frames of adjacent resistance units, the gap being equal to or larger than a second distance to provide insulation between the adjacent resistance units. The second distance is twice the first distance. The first distance is equal to or larger than 45 mm.

Because each base part is configured separately from other base parts, each base part can be transported with the resistance unit and the cooling fan attached but without being coupled to other base parts. So that if the total dimensions (width, height, and depth) of the base part and the resistance unit are smaller than the entrance width, the height, and the depth of an elevating machine, such as an elevator, a set of the base part, the resistance unit, and the cooling fan can be transported in the elevating machine.

After carrying in the base part, the resistance unit, and the cooling fan, work steps such as positioning considering the positional relationship among the base parts and connecting cables between resistance units need to be conducted. These work steps are easier than securing the resistance unit and the cooling fan to the base part or wiring inside the resistance unit, and therefore can easily be conducted at the site where the load testing apparatus is set up.

Even when the base parts are positioned in a manner making contact with each other, the resistance units do not touch each other, maintaining a gap of the second distance or larger, because the frame of each resistance unit is positioned in the inner side than the outer profile of the base part. Thus the separately provided base parts can easily be disposed, maintaining insulation between the resistance units.

In particular, the second distance can be set to 90 mm or larger in the present invention, and thus the insulation between adjacent two resistance units can be maintained even when a voltage of 6600 V is impressed on each of the two resistance units.

The resistance units may be first to sixth resistance units. The cooling fans are first to sixth cooling fans. The base parts are first to sixth base parts. The first base part includes the first cooling fan, the first resistance unit being disposed on a top of the first base part via the insulator. The second base part includes the second cooling fan, the second resistance unit being disposed on a top of the second base part via the insulator. The third base part includes the third cooling fan, the third resistance unit being disposed on a top of the third base part via the insulator. The fourth base part includes the fourth cooling fan, the fourth resistance unit being disposed on a top of the fourth base part via the insulator. The fifth base part includes the fifth cooling fan, the fifth resistance unit being disposed on a top of the fifth base part via the insulator. The sixth base part includes the sixth cooling fan, the sixth resistance unit being disposed on a top of the sixth base part via the insulator. The first base part, the third base part, and the fifth base part are separable from each other. The second base part, the fourth base part, and the sixth base part are separable from each other. The first resistance unit and the second resistance unit are disposed along x direction perpendicular to the z direction with a gap equal to or larger than the second distance. The third resistance unit and the fourth resistance unit are disposed along the x direction with a gap equal to or larger than the second distance. The fifth resistance unit and the sixth resistance unit are disposed along the x direction with a gap equal to or larger than the second distance. The first resistance unit, the third resistance unit, and the fifth resistance unit are disposed along y direction perpendicular to both the x direction and the z direction with a gap equal to or larger than a third distance larger than the second distance. The second resistance unit, the fourth resistance unit, and the sixth resistance unit are disposed along the y direction with a gap equal to or larger than the third distance.

The first base part and the second base part may be integrated. The third base part and the fourth base part are integrated. The fifth base part and the sixth base part are integrated.

When an elevating machine has dimensions allowing two base parts to be carried in at a time, that is, when the total dimensions (width, height, and depth) of two sets, each consisting of the base part, the resistance unit, and the cooling fan, adjoining in the x direction are smaller than the entrance width, the height, and the depth of the elevating machine, the two sets can be carried into the elevating machine with the two base parts adjoining in the x direction (for example, the first base part and the second base part) coupled to each other.

The resistor-group may be configured with a plurality of bar resistors each extending in the y direction arrayed along the x direction. A gap adjusting member is provided between the first base part and the third base part, the second base part and the fourth base part, the third base part and the fifth base part, and the fourth base part and the sixth base part. A width of the gap adjusting member in the y direction is larger than the second distance. The third distance is a sum of twice the first distance and the width of the gap adjusting member in the y direction. A projecting length of a terminal of the resistor projecting from the frame covering a side face of the resistor-group is smaller than the first distance.

Since the terminals of the resistors project in the y direction from the frames covering side faces of the resistor-groups of the resistance units, the distance between distal ends of the terminals is smaller than the third distance. However, since the gap adjusting member having the width larger than the second distance is provided therebetween, the distance between distal ends of the terminals is larger than the second distance, and thus insulation by separation is maintained.

The load testing apparatus further may include a coupling cable or a shorting bar. The coupling cable or the shorting bar is a coupling member used for detachably coupling, in a serial manner, adjacent resistor-groups of two resistance units adjacent along the x direction with a gap equal to or larger than the second distance, at least two couplings being provided between the resistor-groups adjacent along the x direction. The insulator has a size corresponding to a rated voltage of a power source when conducting a load test of the power source using a group of resistance units including serially connected resistor-groups of two resistance units adjacent along the x direction with a gap equal to or larger than the second distance.

The coupling cable or the shorting bar may be coupled to the resistor-group via a switching device including a case filled with an inactive gas, the case being embedded with a fixed connection point, a movable connection point, and a driving member that drives the movable connection point.

The load testing apparatus further may include three coupling switch units, each of the three coupling switch units including a main body, a switching unit for controlling resistor-groups used for a load test among the plurality of resistor-groups, and a first bus bar coupled to a first terminal of the switching unit and one of power source lines from a power source subjected to the load test. A terminal of the resistor of the resistor-group is coupled to a second terminal of the switching unit. The main body includes a first face and a second face vertical to the first face, the switching unit being attached to the first face, the first bus bar being attached to the second face via an insulator with a certain gap between the first bus bar and the second face. The three coupling switch units are detachably attached to the first resistance unit, the third resistance unit, and the fifth resistance unit so as each of the three switching units to be positioned between the first bus bar and the terminal of the resistor coupled to the switching unit via a coupling cable.

Use of the coupling switch unit including the first bus bar and the switching unit allows efficient wiring of components constituting the load testing apparatus.

In particular, since the switching unit is positioned between the terminal of the resistor and the first bus bar, the resistor and the switching unit as well as the switching unit and the first bus bar can be coupled using a short coupling member (e.g., a cable).

A sleeve shaped hood may be provided between the cooling fan and the resistance unit to introduce cooling air from the cooling fan to the resistance unit, the cooling fan being each of the first to sixth cooling fans, the resistance unit being each of the first to sixth resistance units. An upper portion of the sleeve shaped hood is positioned in an inner side of the frame covering a side face of the resistor-group with a gap of 10 mm or larger between the hood and the frame.

The resistance units may be a first resistance unit and a second resistance unit. The cooling fans are a first cooling fan and a second cooling fan. The base parts are a first base part and a second base part. The first base part includes the first cooling fan, the first resistance unit being disposed on a top of the first base part. The second base part includes the second cooling fan, the second resistance unit being disposed on a top of the second base part. The first resistance unit and the second resistance unit are disposed along x direction perpendicular to the z direction with a gap equal to or larger than the second distance.

A load testing apparatus according to one or more embodiments of the present invention includes at least two resistance units each configured with a plurality of resistor-groups and including a frame configured with an insulating material covering a side face of the resistor-groups, each of the resistor-groups including an array of resistors, and at least two cooling parts each including a cooling fan and provided separately. At least one of the resistance units is attached to each of the cooling parts via an insulator.

A face of the frame that at least faces another adjacent resistance unit is positioned in an inner side of a side face of the cooling part, to which the resistance unit is attached, by a first distance when viewed from above. The at least two resistance units are disposed to have a gap between the frames of adjacent resistance units, the gap being equal to or larger than a second distance to provide insulation between the adjacent resistance units. The second distance is twice the first distance. The first distance is equal to or larger than 45 mm.

The resistance units may be a first resistance unit and a second resistance unit. The cooling fans are a first cooling fan and a second cooling fan. The cooling parts are a first cooling part and a second cooling part. The first cooling part includes the first cooling fan, the first resistance unit being attached to the first cooling part. The second cooling part includes the second cooling fan, the second resistance unit being attached to the second cooling part. The first resistance unit and the second resistance unit are disposed with a gap equal to or larger than the second distance.

The cooling fan may exhaust air in a horizontal direction. The resistance unit includes an air inlet opening in the horizontal direction and an exhaust outlet opening in the horizontal direction. A duct including an air inlet opening in the horizontal direction and an exhaust outlet opening in a vertical direction provided in a downstream from the resistance unit is provided to exhaust air upward.

According to one or more embodiments of the present invention, a load testing apparatus that is configured with a plurality of resistance units and can be transported and set up easily, can be provided.

DESCRIPTION OF EMBODIMENTS

Figure 1:
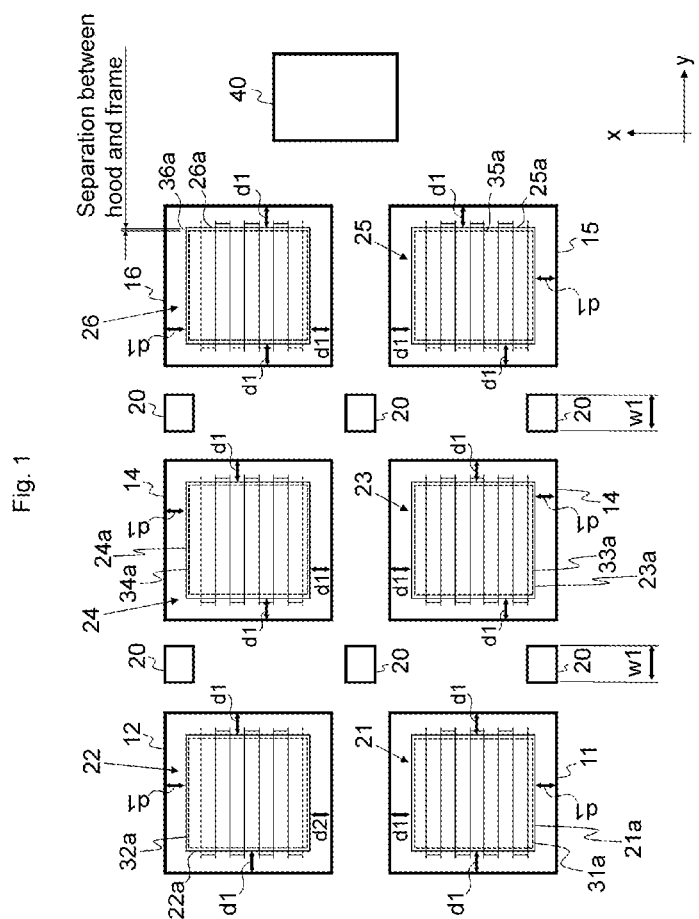
FIG. 1 is a top view illustrating a dry load testing apparatus according to an embodiment where base parts are not yet positioned to adjoin the adjacent base parts.

An embodiment will be described below referring to the drawings. A dry load testing apparatus 1 according to the embodiment includes a first base part 11 to a sixth base part 16, gap adjusting members 20, a first resistance unit 21 to a sixth resistance unit 26, a first cooling fan 31 to a sixth cooling fan 36, a power source connector 40, insulators 50, and a coupling cable 60 (see FIGS. 1 to 13).

The configuration of each component will be described first, and then the wiring between the power source connector 40 and each resistance unit will be described (see FIGS. 14 to 24). In FIGS. 1 to 13, components related to wirings, such as a coupling switch unit 70, are omitted.

The first base part 11 has an approximately cuboid external form. The first cooling fan 31 is provided in the upper portion of the first base part 11. An air inlet for the first cooling fan 31 is provided on a side face or the bottom face in the lower portion of the first base part 11. An exhaust outlet for the first cooling fan 31 is provided on the top face of the first base part 11. The first resistance unit 21 is disposed on the top of the first base part 11 via the insulators 50.

The second base part 12 has an approximately cuboid external form. The second cooling fan 32 is provided in the upper portion of the second base part 12. An air inlet for the second cooling fan 32 is provided on a side face or the bottom face in the lower portion of the second base part 12. An exhaust outlet for the second cooling fan 32 is provided on the top face of the second base part 12. The second resistance unit 22 is disposed on the top of the second base part 12 via the insulators 50.

The third base part 13 has an approximately cuboid external form. The third cooling fan 33 is provided in the upper portion of the third base part 13. An air inlet for the third cooling fan 33 is provided on a side face or the bottom face in the lower portion of the third base part 13. An exhaust outlet for the third cooling fan 33 is provided on the top face of the third base part 13. The third resistance unit 23 is disposed on the top of the third base part 13 via the insulators 50.

The fourth base part 14 has an approximately cuboid external form. The fourth cooling fan 34 is provided in the upper portion of the fourth base part 14. An air inlet for the fourth cooling fan 34 is provided on a side face or the bottom face in the lower portion of the fourth base part 14. An exhaust outlet for the fourth cooling fan 34 is provided on the top face of the fourth base part 14. The fourth resistance unit 24 is disposed on the top of the fourth base part 14 via the insulators 50.

The fifth base part 15 has an approximately cuboid external form. The fifth cooling fan 35 is provided in the upper portion of the fifth base part 15. An air inlet for the fifth cooling fan 35 is provided on a side face or the bottom face in the lower portion of the fifth base part 15. An exhaust outlet for the fifth cooling fan 35 is provided on the top face of the fifth base part 15. The fifth resistance unit 25 is disposed on the top of the fifth base part 15 via the insulators 50.

The sixth base part 16 has an approximately cuboid external form. The sixth cooling fan 36 is provided in the upper portion of the sixth base part 16. An air inlet for the sixth cooling fan 36 is provided on a side face or the bottom face in the lower portion of the sixth base part 16. An exhaust outlet for the sixth cooling fan 36 is provided on the top face of the sixth base part 16. The sixth resistance unit 26 is disposed on the top of the sixth base part 16 via the insulators 50.

The configuration may include a base plate or an anti-vibration insulation rubber (not shown) between the insulator 50 and the base part.

In the embodiments illustrated in FIGS. 1 to 24, description will be made with directions defined such that a horizontal direction along which the first base part 11 and the second base part 12 are disposed is x direction, a horizontal direction along which the first base part 11, the third base part 13, and the fifth base part 15 are disposed is y direction, and the direction perpendicular to both the y and x directions is z direction.

In the description, the side in which the first resistance unit 21 and the second resistance unit 22 are disposed is the front side, and the side in which the power source connector 40 is disposed is the rear side. For example, the back face of a first frame 21*a* of the first resistance unit 21 opposes the front face of a third frame 23*a* of the third resistance unit 23. A side face of the first frame 21*a* of the first resistance unit 21 opposes a side face of the second frame 22*a* of the second resistance unit 22.

The first base part 11 and the second base part 12 are adjacently positioned without a gap along the x direction.

The third base part 13 and the fourth base part 14 are adjacently positioned without a gap along the x direction.

The fifth base part 15 and the sixth base part 16 are adjacently positioned without a gap along the x direction.

The first base part 11, the third base part 13, and the fifth base part 15 are positioned along the y direction with the gap adjusting member 20 between the base parts.

The second base part 12, the fourth base part 14, and the sixth base part 16 are positioned along the y direction with the gap adjusting member 20 between the base parts.

The gap adjusting member 20 has an approximately cuboid shape with the width in the y direction of w1. The gap adjusting member 20 is positioned between the base parts to provide a separation between the base parts by the width of w1 or larger. The width w1 of the gap adjusting member 20 is larger than a second distance d2, which will be described later (for example, 510 mm).

It may be configured to provide a gap also between the first base part 11 and the second base part 12, the third base part 13 and the fourth base part 14, and the fifth base part 15 and the sixth base part 16 by, for example, disposing the gap adjusting member 20 when positioning the base parts. In this case, wiring spaces for cables or the like can easily be provided between the first base part 11 and the second base part 12, the third base part 13 and the fourth base part 14, and the fifth base part 15 and the sixth base part 16.

Each of the first resistance unit 21 to the sixth resistance unit 26 is configured with a plurality of stages of resistor-groups arranged along the z direction and connected in parallel. Each of the resistor-groups includes a plurality of serially connected bar resistors R each positioned parallel to the y direction with a predetermined gap between adjacent bar resistors R along the x direction. The resistance unit includes a frame (the first frame 21*a* to the sixth frame 26*a*) configured with an insulating material covering the side faces of the resistor-groups. The load condition of a power source to be tested, such as a generator, is changed by selecting the resistor-groups to be used when conducting a load test of the power source.

In the embodiments illustrated in FIGS. 1 to 24, each of the first resistance unit 21 to the sixth resistance unit 26 is configured with eight resistor-groups arranged along the z direction and connected in parallel, where each of the resistor-groups includes eight bar resistors R each positioned parallel to the y direction with a predetermined gap between adjacent bar resistors R along the x direction and the bar resistors R are connected in series using shorting bars or the like. The number of resistors R arrayed in each resistor-group and the number of arranged resistor-groups are not limited to the numbers described above.

The first resistance unit 21 includes, from the upper stage to the lower stage, an 11th resistor-group R11 to an 18th resistor-group R18. The second resistance unit 22 includes, from the upper stage to the lower stage, a 21st resistor-group R21 to a 28th resistor-group R28. The third resistance unit 23 includes, from the upper stage to the lower stage, a 31st resistor-group R31 to a 38th resistor-group R38. The fourth resistance unit 24 includes, from the upper stage to the lower stage, a 41st resistor-group R41 to a 48th resistor-group R48. The fifth resistance unit 25 includes, from the upper stage to the lower stage, a 51st resistor-group R51 to a 58th resistor-group R58. The sixth resistance unit 26 includes, from the upper stage to the lower stage, a 61st resistor-group R61 to a 68th resistor-group R68.

The top face and the bottom face of each resistor-group are opened to allow cooling air from the cooling fan provided below the resistor-group to flow upward. The side faces of each resistor-group are covered with a frame (the first frame 21*a* to the sixth frame 26*a*) made of an insulating material to enhance insulation between adjacent resistance units. Both terminals of each resistor R are held by the front face and the back face of the frame.

The dimensions and positional relationship of the first base part 11 and the first resistance unit 21 are determined such that at least the face of the first frame 21a, covering the sides of the resistor-groups of the first resistance unit 21 (the 11th resistor-group R11 to the 18th resistor-group R18), opposing another resistance unit (the second resistance unit 22 or the third resistance unit 23) is positioned in the (horizontally) inner side of a side face of the first base part 11 by a first distance d1 (45 mm or larger) when viewed from above.

The dimensions and positional relationship of the second base part 12 and the second resistance unit 22 are determined such that at least the face of the second frames 22a, covering the sides of the resistor-groups of the second resistance unit 22 (the 21st resistor-group R21 to the 28th resistor-group R28), opposing another resistance unit (the first resistance unit 21 or the fourth resistance unit 24) is positioned in the (horizontally) inner side of a side face of the second base part 12 by the first distance d1 when viewed from above.

The dimensions and positional relationship of the third base part 13 and the third resistance unit 23 are determined such that at least the face of the third frames 23a, covering the sides of the resistor-groups of the third resistance unit 23 (the 31st resistor-group R31 to the 38th resistor-group R38), opposing another resistance unit (the first resistance unit 21, the fourth resistance unit 24, or the fifth resistance unit 25) is positioned in the (horizontally) inner side of a side face of the third base part 13 by the first distance d1 when viewed from above.

The dimensions and positional relationship of the fourth base part 14 and the fourth resistance unit 24 are determined such that at least the face of the fourth frames 24a, covering the sides of the resistor-groups of the fourth resistance unit 24 (the 41st resistor-group R41 to the 48th resistor-group R48), opposing another resistance unit (the second resistance unit 22, the third resistance unit 23 or the sixth resistance unit 26) is positioned in the (horizontally) inner side of a side face of the fourth base part 14 by the first distance d1 when viewed from above.

The dimensions and positional relationship of the fifth base part 15 and the fifth resistance unit 25 are determined such that at least the face of the fifth frames 25a, covering the sides of the resistor-groups of the fifth resistance unit 25 (the 51st resistor-group R51 to the 58th resistor-group R58), opposing another resistance unit (the third resistance unit 23 or the sixth resistance unit 26) is positioned in the (horizontally) inner side of a side face of the fifth base part 15 by the first distance d1 when viewed from above.

The dimensions and positional relationship of the sixth base part 16 and the sixth resistance unit 26 are determined such that at least the face of the sixth frames 26a, covering the sides of the resistor-groups of the sixth resistance unit 26 (the 61st resistor-group R61 to the 68th resistor-group R68), opposing another resistance unit (the fourth resistance unit 24 or the fifth resistance unit 25) is positioned in the (horizontally) inner side of a side face of the sixth base part 16 by the first distance d1 when viewed from above.

The terminals of the resistors R of each of the first resistance unit 21 to the sixth resistance unit 26 project in the y direction from the frame (the first frame 21a to the sixth frame 26a) covering the side faces of the resistor-groups of each resistance unit. The dimensions of the first resistance unit 21 to the sixth resistance unit 26 are determined such that the projecting length of the terminal is smaller than the first distance d1.

For the first frame 21a to the sixth frame 26a, the face not opposing another resistance unit may be configured to be in the inner side of a side face of the respective base part among the first base part 11 to the sixth base part 16 by the first distance d1 when viewed from above. In this a case, the resistance units as well as the base parts can be made of an identical material, and the first base part 11 to the sixth base part 16 can be interchangeably positioned.

At least one (which is not coupled to the coupling cable 60, which will be described later) of terminals of serially connected resistors R constituting the resistor-group of each of the first resistance unit 21, the third resistance unit 23, and the fifth resistance unit 25 is coupled to the power source connector 40 via the coupling switch unit 70, which will be described later.

At least one (which is not coupled to the coupling cable 60, which will be described) of terminals of serially connected resistors R constituting the resistor-group of each of the second resistance unit 22, the fourth resistance unit 24, and the sixth resistance unit 26 is mutually coupled at a neutral point.

Figure 2:
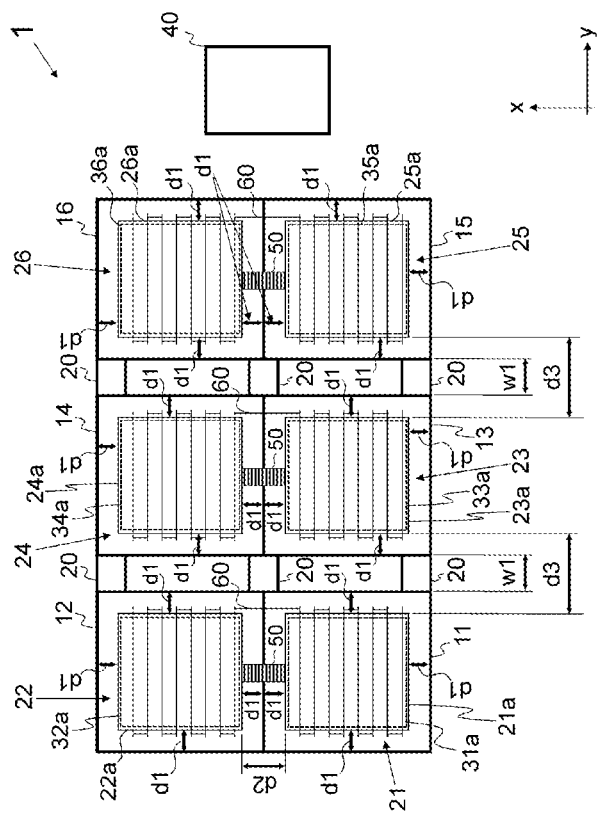
FIG. 2 is a top view illustrating the dry load testing apparatus according to the embodiment where the base parts are adjoined to the adjacent base parts.
Figure 3:
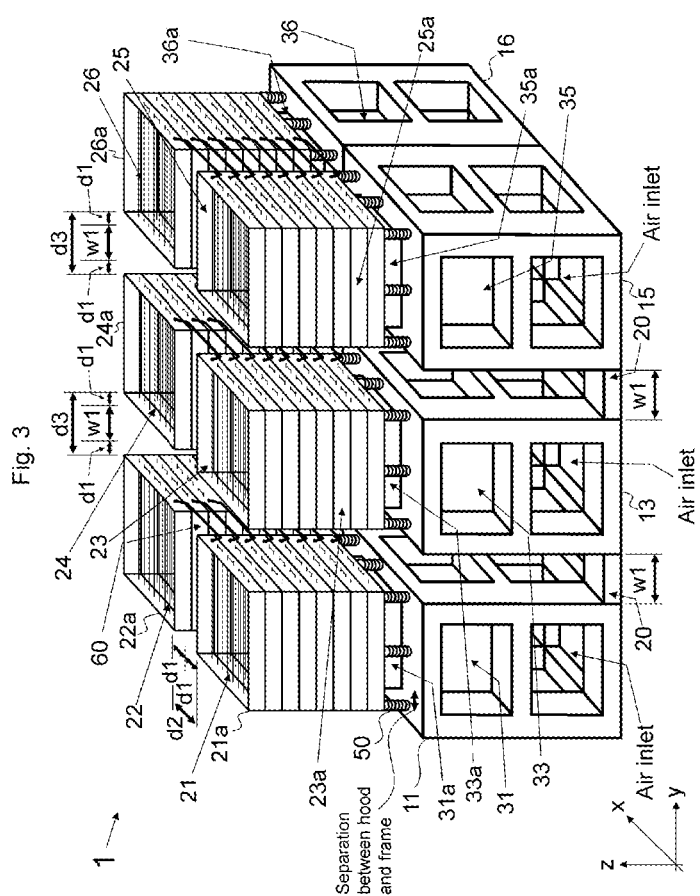
FIG. 3 is a perspective view illustrating a configuration of first to sixth resistance units, first to sixth base parts, insulators, and first to sixth cooling fans.
Figure 4:
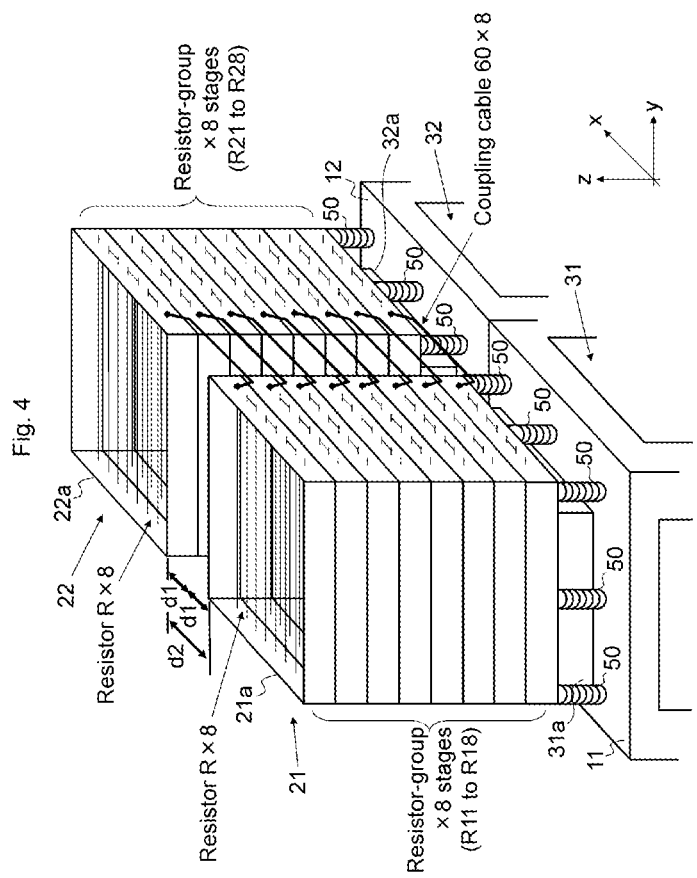
FIG. 4 is a perspective view illustrating a configuration of the first and second resistance units, the insulators, and the first and second base parts.

To achieve highly efficient cooling by the cooling fan, resistors R of resistor-groups are arrayed in such a manner that, when viewed from the z direction, a resistor R of a resistor-group comes in the middle between the resistors R adjacent in the x direction of another resistor-group adjacent in the z direction. In FIGS. 1 and 2, the resistors R in the top stage are illustrated, but illustration of the resistors R of the second stage and below is omitted.

The first resistance unit 21, the third resistance unit 23, and the fifth resistance unit 25 are disposed along the y direction with a gap of a third distance d3 or larger between resistance units. The second resistance unit 22, the fourth resistance unit 24, and the sixth resistance unit 26 are disposed along the y direction with a gap of the third distance d3 or larger between resistance units. The third distance d3 is larger than the distance that creates insulation by separation between resistance units adjacent in the y direction (for example, the first resistance unit 21 and the third resistance unit 23). The third distance d3 is such that a personnel can work in the gap between the base parts (or between the resistance units) for wiring or the like (for example, the third distance d3 between resistance units is 600 mm, and the width w1 between base parts is 510 mm).

The first resistance unit 21 and the second resistance unit 22 are disposed along the x direction with a gap of the second distance d2 or larger between resistance units. The third resistance unit 23 and the fourth resistance unit 24 are disposed along the x direction with a gap of the second distance d2 or larger between resistance units. The fifth resistance unit 25 and the sixth resistance unit 26 are disposed along the x direction with a gap of the second distance d2 or larger between resistance units. The second distance d2 has the length (for example, 90 mm) that creates insulation by separation between resistance units adjacent in the x direction (for example, the first resistance unit 21 and the second resistance unit 22).

The second distance d2 is equal to twice the first distance d1. The third distance d3 is equal to the sum of twice the first distance d1 and the width w1 of the gap adjusting member 20 ($d2=d1\times 2$, $d3=d1\times 2+w1$).

Even when the first base part 11 and the second base part 12 are disposed along the x direction without a gap therebetween, the first resistance unit 21 and the second resistance unit 22 are separated by at least the second distance d2 (twice the first distance d1, i.e. 90 mm, or larger). So that insulation between the first resistance unit 21 and the second resistance unit 22 is maintained even when a high voltage of 6600 V is impressed on each of the first resistance unit 21 and the second resistance unit 22.

Even when the third base part 13 and the fourth base part 14 are disposed along the x direction without a gap therebetween, the third resistance unit 23 and the fourth resistance unit 24 are separated by at least the second distance d2 (twice the first distance d1, i.e. 90 mm, or larger). So that insulation between the third resistance unit 23 and the fourth resistance unit 24 is maintained even when a high voltage of 6600 V is impressed on each of the third resistance unit 23 and the fourth resistance unit 24.

Even when the fifth base part 15 and the sixth base part 16 are disposed along the x direction without a gap therebetween, the fifth resistance unit 25 and the sixth resistance unit 26 are separated by at least the second distance d2 (twice the first distance d1, i.e., 90 mm, or larger). So that insulation between the fifth resistance unit 25 and the sixth resistance unit 26 is maintained even when a high voltage of 6600 V is impressed on each of the fifth resistance unit 25 and the sixth resistance unit 26.

Even when the first base part 11 and the third base part 13 are disposed along the y direction with the gap adjusting member 20 without a gap, the first resistance unit 21 and the third resistance unit 23 are separated by at least the third distance d3 (the sum of twice the first distance d1 and the width w1 of the gap adjusting member 20, i.e. 600 mm, or larger). So that insulation between the first resistance unit 21 and the third resistance unit 23 is maintained even when a high voltage of 6600 V is impressed on each of the first resistance unit 21 and the third resistance unit 23.

Since the terminals of the resistors R project in the y direction from the frames (the first frame 21a and the third frame 23a) covering side faces of the resistor-groups of each of the first resistance unit 21 and the third resistance unit 23, the distance between distal ends of the terminals is smaller than the third distance d3. However, since the gap adjusting member 20 having the width w1 larger than the second distance d2 is provided therebetween, the distance between distal ends of the terminals is larger than the second distance d2, and thus insulation by separation is maintained.

Even when the third base part 13 and the fifth base part 15 are disposed along the y direction with the gap adjusting member 20 without a gap, the third resistance unit 23 and the fifth resistance unit 25 are separated by at least the third distance d3 (the sum of twice the first distance d1 and the width w1 of the gap adjusting member 20, i.e. 600 mm, or larger). So that insulation between the third resistance unit 23 and the fifth resistance unit 25 is maintained even when a high voltage of 6600 V is impressed on each of the third resistance unit 23 and the fifth resistance unit 25.

Since the terminals of the resistors R project in the y direction from the frames (the third frame 23a and the fifth frame 25a) covering side faces of the resistor-groups of each of the third resistance unit 23 and the fifth resistance unit 25, the distance between distal ends of the terminals is smaller than the third distance d3. However, since the gap adjusting member 20 having the width w1 larger than the second distance d2 is provided therebetween, the distance between distal ends of the terminals is larger than the second distance d2, and thus insulation by separation is maintained.

Even when the second base part 12 and the fourth base part 14 are disposed along the y direction with the gap adjusting member 20 without a gap, the second resistance unit 22 and the fourth resistance unit 24 are separated by at least the third distance d3 (the sum of twice the first distance d1 and the width w1 of the gap adjusting member 20, i.e. 600 mm, or larger). So that insulation between the second resistance unit 22 and the fourth resistance unit 24 is maintained even when a high voltage of 6600 V is impressed on each of the second resistance unit 22 and the fourth resistance unit 24.

Since the terminals of the resistors R project in the y direction from the frames (the second frame 22a and the fourth frame 24a) covering side faces of the resistor-groups of each of the second resistance unit 22 and the fourth resistance unit 24, the distance between distal ends of the terminals is smaller than the third distance d3. However, since the gap adjusting member 20 having the width w1 larger than the second distance d2 is provided therebetween, the distance between distal ends of the terminals is larger than the second distance d2, and thus insulation by separation is maintained.

Even when the fourth base part 14 and the sixth base part 16 are disposed along the y direction with the gap adjusting member 20 without a gap, the fourth resistance unit 24 and the sixth resistance unit 26 are separated by at least the third distance d3 (the sum of twice the first distance d1 and the width w1 of the gap adjusting member 20, i.e. 600 mm, or larger). So that insulation between the fourth resistance unit 24 and the sixth resistance unit 26 is maintained even when a high voltage of 6600 V is impressed on each of the fourth resistance unit 24 and the sixth resistance unit 26.

Since the terminals of the resistors R project in the y direction from the frames (the fourth frame 24a and the sixth frame 26a) covering side faces of the resistor-groups of each of the fourth resistance unit 24 and the sixth resistance unit 26, the distance between distal ends of the terminals is smaller than the third distance d3. However, since the gap adjusting member 20 having the width w1 larger than the second distance d2 is provided therebetween, the distance between distal ends of the terminals is larger than the second distance d2, and thus insulation by separation is maintained.

The first resistance unit 21 and the second resistance unit 22 are used for a load test of R phase. The third resistance unit 23 and the fourth resistance unit 24 are used for a load test of S phase. The fifth resistance unit 25 and the sixth resistance unit 26 are used for a load test of T phase.

A sleeve shaped hood (a first hood 31a to a sixth hood 36a) is provided between the cooling fan (the first cooling fan 31 to the sixth cooling fan 36) and the resistance unit (the first resistance unit 21 to the sixth resistance unit 26) (see dotted lines illustrated in FIGS. 1 and 2). The hood introduces cooling air from the cooling fan to the resistance unit. The upper portion of the sleeve shaped hood is positioned in the inner side of the frame (the first frame 21a to the sixth frame 26a) covering the side faces of the resistor-group in the lowermost stage, desirably with a separation of 10 mm or larger between the hood and the frame.

The hood and the frame, both made of an insulating material, can be kept insulated by being separated from each other without accumulation of dust.

Each of the first resistance unit 21 to the sixth resistance unit 26 meets the requirements (e.g., the number of resistors R or a resistance value) corresponding to the rated voltage of a power source to be tested when conducting a power source load test under the condition in which the resistance units are not serially connected.

For example, each of the first resistance unit 21 to the sixth resistance unit 26 meets the requirements (e.g., the number of resistors R or a resistance value) corresponding to the rated voltage of a power source to be tested when conducting a load test of a three phase alternating power source using three resistance units among the first resistance unit 21 to the sixth resistance unit 26.

The first cooling fan 31 to the sixth cooling fan 36 meet the requirements (e.g., cooling performance of a fan) for cooling the first resistance unit 21 to the sixth resistance unit 26, respectively, during a power source load test.

The power source connector 40 includes a vacuum circuit breaker (VCB) 41, an operating unit (not shown), and a controlling device 43 such as a CPU. Connection to the power source to be tested is made via the vacuum circuit breaker 41.

The operating unit is used for conducting operations, such as selecting the number of resistor-groups to be connected to the power source to be tested, changing loads, switching on and off the power source of the load testing apparatus 1, and switching on and off of the first cooling fan 31 to the sixth cooling fan 36.

In response to an operation related to a load instructed through the operating unit, the controlling device 43 controls on and off of a switching device (a first switching unit SW1 to an eighth switching unit SW8) of the coupling switch unit 70, which will be described later, to switch the resistor-groups to be used.

The insulator 50 is provided between the resistance unit impressed with a high voltage, that is, the first resistance unit 21 to the sixth resistance unit 26, and a peripheral component (i.e., the first base part 11 to the sixth base part 16 and the first cooling fan 31 to the sixth cooling fan 36).

The insulator 50 is used to provide insulation between a main body 71 and a first bus bar 73 in the coupling switch unit 70, which will be described later, as well as between the main body 71 and the resistance unit.

Figure 5:
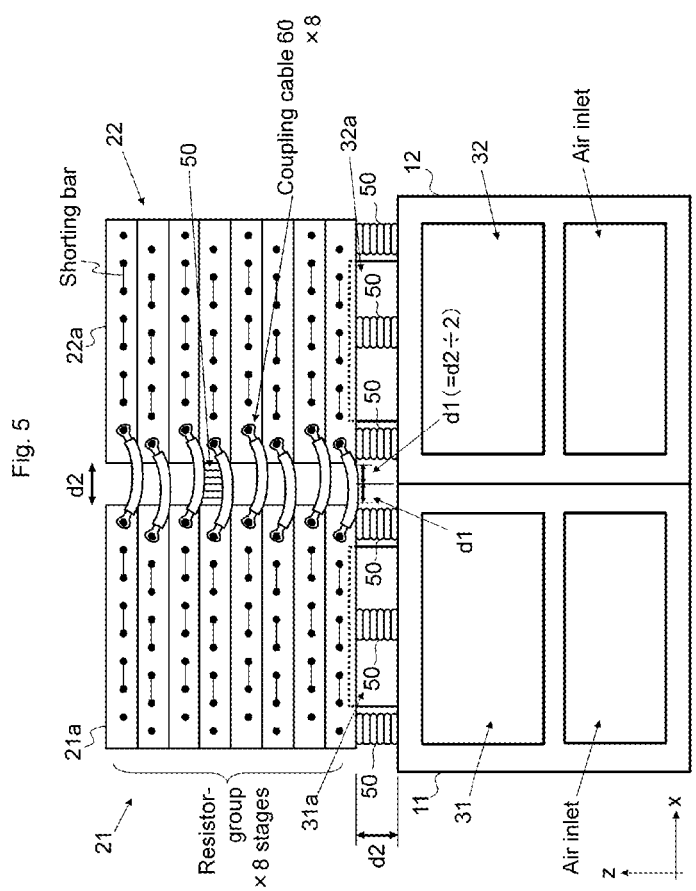
FIG. 5 is a back view illustrating the configuration of the first and second resistance units, the insulators, and the first and second base parts.
Figure 6:
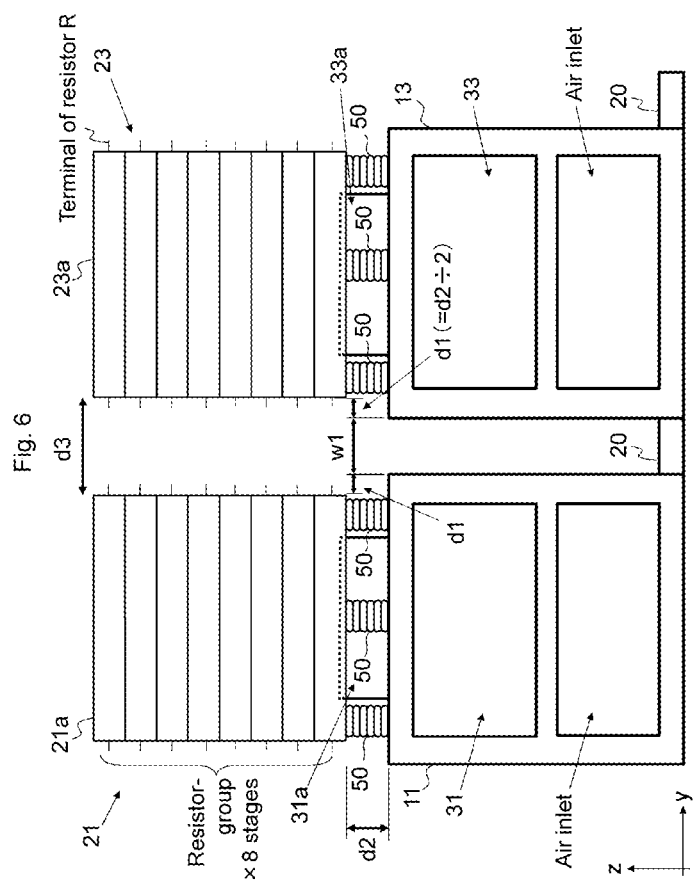
FIG. 6 is a side view illustrating the configuration of the first and third resistance units, the insulators, and the first and third base parts.

Desirably, the insulator 50 is also provided between the first resistance unit 21 and the second resistance unit 22, the third resistance unit 23 and the fourth resistance unit 24, and the fifth resistance unit 25 and the sixth resistance unit 26 for the purpose of, for example, providing insulation between resistance units adjacent along the x direction (see FIGS. 2 and 5).

The insulator 50 meets the requirements (e.g., a size) corresponding to the rated voltage of a power source to be tested when conducting a power source load test using a group of resistance units including serially connected resistor-groups of two resistance units adjacent along the x direction with the second distance d2 therebetween (the first resistance unit 21 and the second resistance unit 22, the third resistance unit 23 and the fourth resistance unit 24, or the fifth resistance unit 25 and the sixth resistance unit 26). In particular, the dimension in the z direction of the insulator 50 provided beneath the resistance unit is equal to or larger than the second distance d2.

For example, the insulator 50 meets the requirements (e.g., a size) corresponding to the rated voltage of a power source to be tested when conducting a load test of a three phase alternating power source using three groups of resistance units each including serially connected resistor-groups of two resistance units adjacent along the x direction with the second distance d2 therebetween (the first resistance unit 21 and the second resistance unit 22, the third resistance unit 23 and the fourth resistance unit 24, or the fifth resistance unit 25 and the sixth resistance unit 26).

That is, each insulator 50 meets the requirements corresponding to twice the rated voltage of the power source which is to be tested and corresponds to the requirements of each of the first resistance unit 21 to the sixth resistance unit 26 and the first cooling fan 31 to the sixth cooling fan 36.

For example, when each of the first resistance unit 21 to the sixth resistance unit 26 meets the requirements corresponding to a 6600 V three phase alternating power source, an insulator 50 which meets the requirements corresponding to a 13200 V three phase alternating power source is used. In this case, the insulator 50 which is taller by several centimeters than an insulator which meets the requirements corresponding to a 6600 V three phase alternating power source is used.

The coupling cables 60 are used for detachably coupling, in a serial manner, (resistors R of) resistor-groups of two resistance units adjacent along the x direction with the second distance d2 therebetween. The cables 60 provide two or more coupling between the resistor-groups adjacent along the x direction.

The number of the coupling cables 60 to be prepared is three times the number of stages of resistor-groups of the resistance unit (in the embodiment, 3×8 stages=24 cables). Each coupling cable 60 couples the terminals of resistors R of the resistor-groups of resistance units adjacent in the x direction, where each coupled terminal is the one close to the adjacent resistance unit.

Although the coupling cable 60 provides coupling for every stage in the described embodiment, at least two among a plurality of resistor-groups may be coupled by the coupling cable 60 instead of providing coupling for every stage. Thus the switching control of resistor-groups during a load test is easier than a configuration coupling two resistance units in serial by only a single coupling (coupling a terminal of a single resistor R). However, a larger number of coupling makes switching control easier.

Ring terminals (illustrated in a black circle in FIGS. 3 and 4) are provided on both sides of the coupling cable 60. The resistor R and the coupling cable 60 can detachably be coupled by hooking the ring terminal on a terminal of the resistor R and screwing the ring terminal (or fixing with a bolt).

Resistor-groups, adjacent in the x direction, of two resistance units can be serially coupled by using the coupling cable 60.

In this manner, a group of resistance units provides twice the resistance value of a single resistance unit. In other words, a power source load test of twice the voltage of a power source subjected to a load test using a single resistance unit can be conducted using a single group of resistance units.

For example, when each of the first resistance unit 21 to the sixth resistance unit 26 meets the requirements corresponding to a 6600 V three phase alternating power source, a load test of a 13200 V three phase alternating power source can be conducted using three groups of resistance units.

A voltage impressed on a group of resistance units is twice the voltage impressed on a single resistance unit. Since the insulator 50 which meets the requirements corresponding to a voltage impressed on a group of resistance units is used, a sufficient separation is provided under impression of twice the voltage, so that insulation between the resistance unit and peripheral components, such as the first base part 11 to the sixth base part 16 and the first cooling fan 31 to the sixth cooling fan 36, and insulation between resistance units are maintained.

Since each coupling cable 60 is connected to each resistor-group, switching control of resistor-groups during a load test is easier than a configuration in which two resistance units are coupled by only a single coupling (coupling a terminal of a single resistor R).

The first resistance unit 21 to the sixth resistance unit 26 and the first cooling fan 31 to the sixth cooling fan 36 may be those considered for a voltage of a power source subjected to a load test that can be performed using a single resistance unit. Thus the requirements can be met easier by using ready-made products compared to the configuration which meets the requirements a group of resistance units by increasing the number of resistors R and the length of the resistor R of a single resistance unit.

The coupling cable 60 can easily be detached from the resistors R when using only the first resistance unit 21, the third resistance unit 23, and the fifth resistance unit 25 (or only the second resistance unit 22, the fourth resistance unit 24, and the sixth resistance unit 26) for a power source load test of a voltage lower than the voltage of a load test conducted with the coupling cables 60 attached.

A separation of the second distance d2 or larger provides higher insulation between the resistance units disposed along the x direction than when the resistance units are disposed without the separation. A separation of the third distance d3 or larger not only provides higher insulation between the resistance units disposed along the y direction than when the resistance units are disposed without the separation but also allows a personnel to easily conduct an operation such as wiring (particularly, attaching and detaching of the coupling cables 60) in a space between resistance units.

The resistor R of each resistance unit extends in the y direction, so the terminal projects from the frame in the y direction (projects from a face of the frame normal to the y direction). No terminal is provided on the face normal to the x direction of the frame of each resistance unit. So that a personnel seldom works in a space between resistance units opposing each other in the x direction. Thus at least a distance that provides insulation between resistance units opposing each other in the x direction is required for a separation distance (the second distance d2). As described above, to provide a space for wiring, such as wiring cables, the base parts may be disposed so as the separation between resistance units to be larger than the second distance d2.

Because the first base part 11 to the sixth base part 16 are configured separately (configured as independent parts), the first base part 11 to the sixth base part 16 can each be transported with the resistance unit and the cooling fan attached but without being coupled to other base parts. So that if the total dimensions (width, height, and depth) of the base part and the resistance unit are smaller than the entrance width, the height, and the depth of an elevating machine, such as an elevator, a set of the base part, the resistance unit, and the cooling fan can be transported in the elevating machine.

After carrying in the base part, the resistance unit, and the cooling fan, a first work step to an eighth work step, such as positioning considering the positional relationship among the base parts, connecting cables between resistance units, coupling the power source connector 40 to components such as the first resistance unit 21 need to be conducted as will be described later. These work steps are easier than securing the resistance unit and the cooling fan to the base part or wiring inside the resistance unit, and therefore can easily be conducted at the site where the load testing apparatus 1 is set up.

Even when the base parts are positioned in a manner making contact with each other, the resistance units do not touch each other, maintaining a gap of the second distance d2 or larger, because the frame of each resistance unit is positioned in the inner side than the outer profile of the base part. Thus the separately provided base parts can easily be disposed, maintaining insulation between the resistance units.

In particular, the second distance d2 can be set to 90 mm or larger in one or more embodiments of the present invention, and thus the insulation between adjacent two resistance units can be maintained even when a voltage of 6600 V is impressed on each of the two resistance units.

When an elevating machine has dimensions allowing two base parts to be carried in at a time, that is, when the total dimensions (width, height, and depth) of two sets, each consisting of the base part, the resistance unit, and the cooling fan, adjoining in the x direction are smaller than the entrance width, the height, and the depth of the elevating machine, the two sets can be carried into the elevating machine with the two base parts adjoining in the x direction (for example, the first base part 11 and the second base part 12) coupled to each other and the resistance units mounted on the base parts coupled via coupling cables 60.

Figure 7:
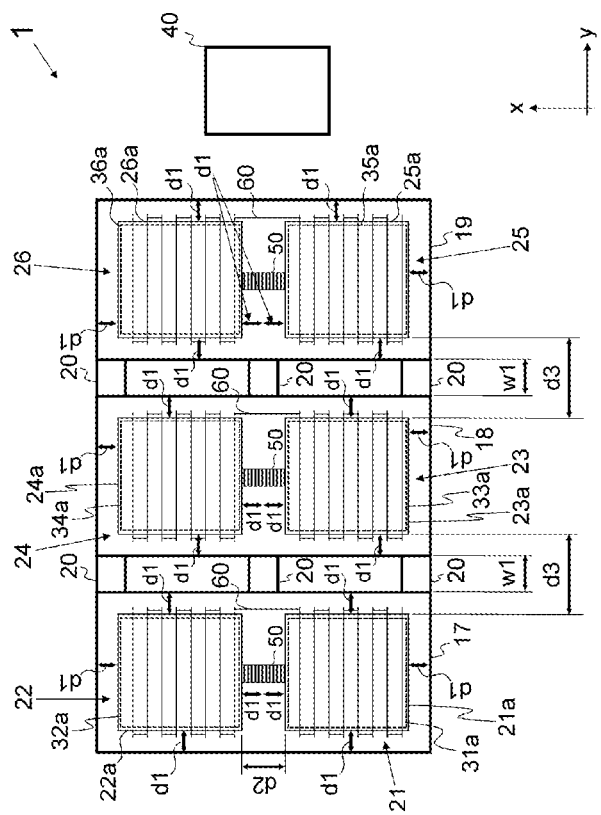
FIG. 7 is a top view illustrating the dry load testing apparatus according to the embodiment in which the base parts adjacent along the x direction are integrated.
Figure 8:
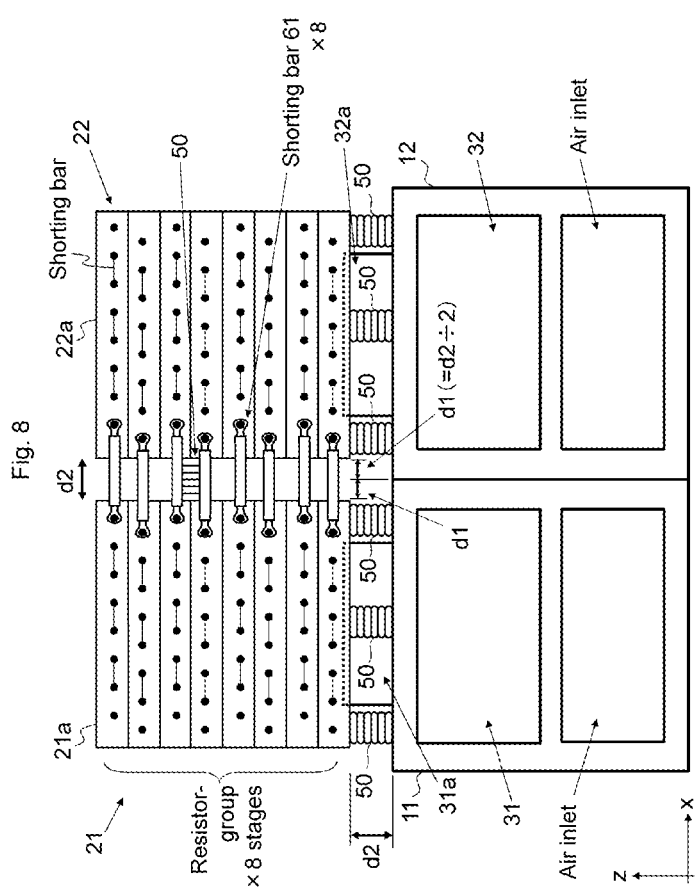
FIG. 8 is a back view illustrating a configuration of the first and second resistance units, the insulators, and the first and second base parts of an embodiment in which the coupling cable illustrated in FIG. 5 is replaced with a shorting bar.
Figure 9:
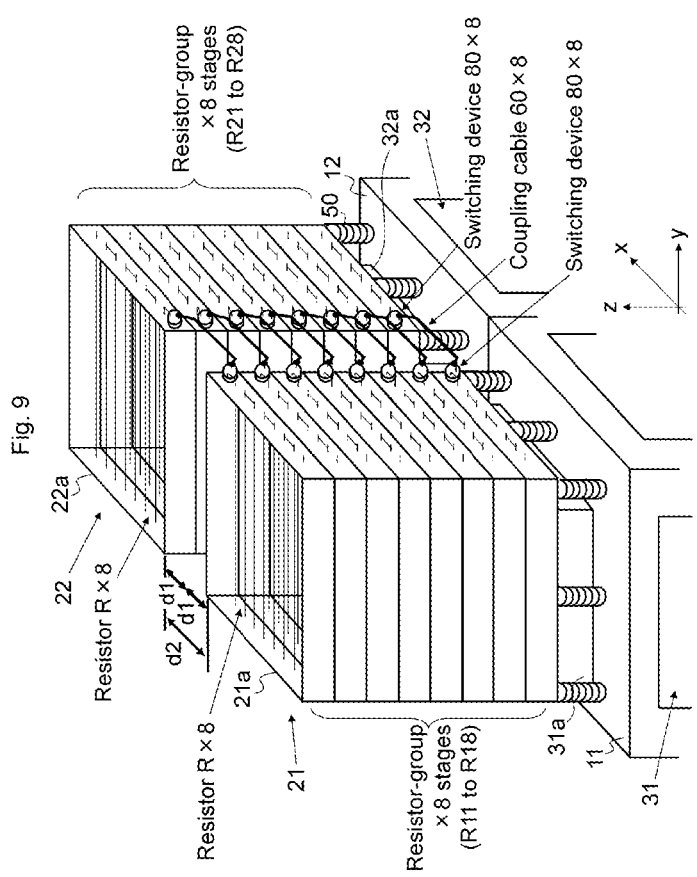
FIG. 9 is a perspective view illustrating a configuration of the first and second resistance units, the insulators, the first and second base parts of an embodiment in which the switching device is used for coupling.
Figure 10:
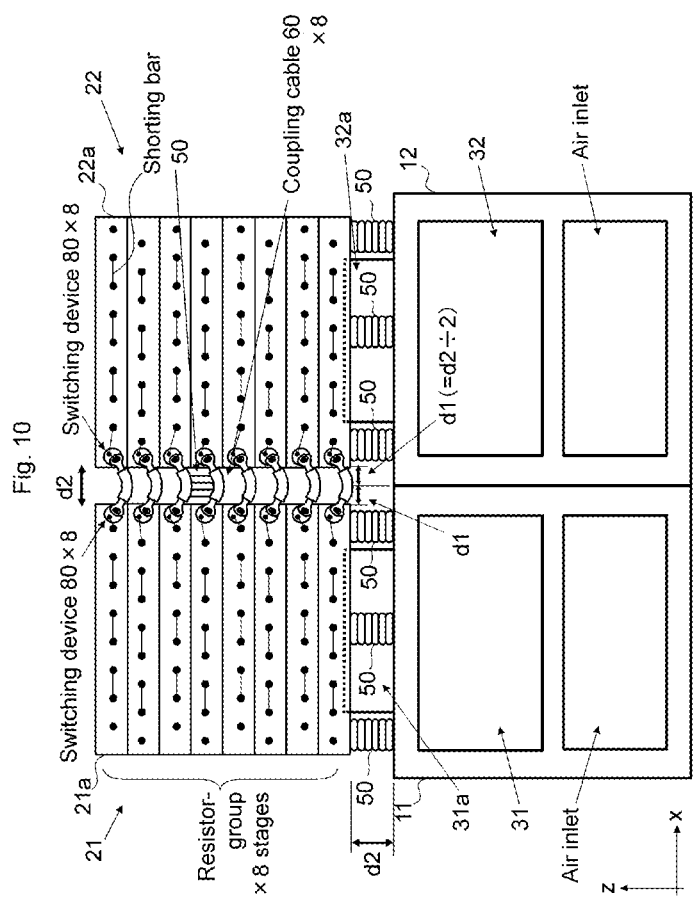
FIG. 10 is a back view illustrating a configuration of the first and second resistance units, the insulators, and the first and second base parts of the embodiment in which the switching device is used for coupling.
Figure 11:
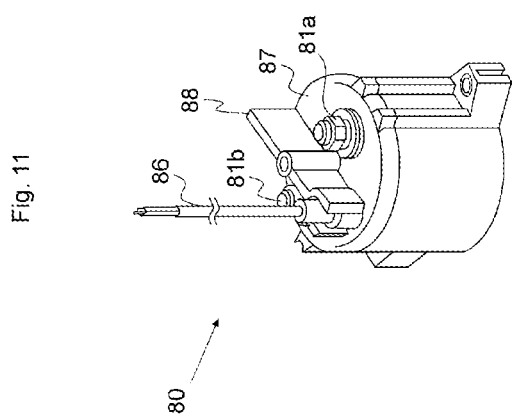
FIG. 11 is a perspective view of the switching device.
Figure 12:
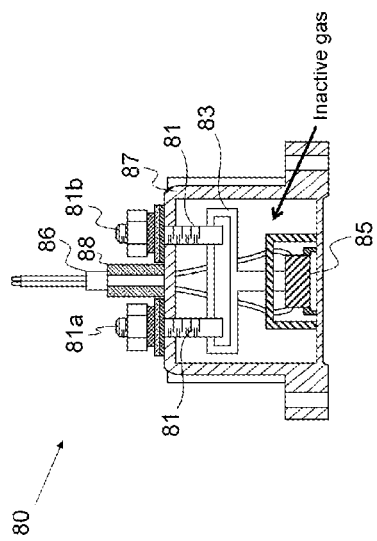
FIG. 12 is a sectional view illustrating a configuration of the switching device.

In this case, the first base part 11 and the second base part 12 may be integrated, the third base part 13 and the fourth base part 14 may be integrated, and the fifth base part 15 and the sixth base part 16 may be integrated (see FIG. 7). FIG. 7 exemplarily illustrates the first base part 11 and the second base part 12 integrated into a seventh base part 17, the third base part 13 and the fourth base part 14 integrated into an eighth base part 18, and the fifth base part 15 and the sixth base part 16 integrated into a ninth base part 19.

In the described embodiment, the resistors R are serially connected in the resistor-group. Alternatively, some or all of the resistors R can be connected in parallel by changing the style of coupling between a terminal of a resistor R and a terminal of another resistor R. The style of coupling between resistors R in the resistor-group may be switched between a serial coupling and a parallel coupling by using a shorting bar or via a switching device. In this case, to meet the requirements of a load test of a three phase alternating power source under a low voltage, the number of parallel connections in the resistor-group may be increased.

In the described embodiment, the coupling cables 60 are used for coupling the resistor-group of a resistance unit and the resistor-group of another resistance unit. Although, the coupling member for coupling resistor-groups is not limited to a cable. For example, similarly to the shorting bar that couples terminals of resistors R, a shorting bar 61 may be used to couple a resistor-group to another resistor-group (see FIG. 8).

In the described embodiment, the coupling cable 60 or the shorting bar 61 is directly coupled to the resistor R. Alternatively, the coupling may be made indirectly via a switching device 80 including a case 87 filled with an inactive gas such as nitrogen. The case 87 is embedded with a fixed connection point 81, a movable connection point 83, and a driving member 85 that drives the movable connection point 83. (see FIGS. 9 to 12).

Specifically, the switching device 80 includes the fixed connection point 81, the movable connection point 83, the driving member 85, a lead wire 86, and the case 87. The switching device 80 is provided in the vicinity of the terminal of the resistor R, in the resistor-group, coupled to the coupling cable 60 or the shorting bar 61.

The terminal projecting outside the case 87 (a first terminal 81a) from one of the fixed connection points 81 of the switching device 80 is coupled to the terminal of the resistor R, and the terminal projecting outside the case 87 (a second terminal 81b) from another fixed connection point 81 is coupled to either of the coupling cable 60 and the shorting bar 61. The resistor R and the first terminal 81a are always coupled to each other, whereas the coupling cable 60 or the shorting bar 61 and the second terminal 81b are coupled to each other when coupling resistance units. An insulating wall 88 is desirably provided between the first terminal 81a and the second terminal 81b to prevent the coupling cable 60 or the shorting bar 61 from accidentally making contact with the first terminal 81a when the coupling cable 60 or the shorting bar 61 is attached to the second terminal 81b as well as to prevent a short circuit between the first terminal 81a and the second terminal 81b (see FIG. 11).

The movable connection point 83 is driven by the driving member 85 to change the state between the on-state, namely when touching the fixed connection point 81 and the off-state, namely when not touching the fixed connection point 81. The coupling cable 60 or the shorting bar 61 is coupled to the second terminal 81b under the off-state.

The driving member 85 is coupled to the controlling device 43 of the power source connector 40 via the lead wire 86 (control signal line). The controlling device 43 of the power source connector 40 controls the operation of the driving member 85 (controls switching between the on-state and the off-state).

The case 87 is embedded with the fixed connection point 81, the movable connection point 83, and the driving member 85, and the inside of the case 87 is filled with an inactive gas.

When the coupling cable 60 or the shorting bar 61 is coupled to the switching device 80 (the second terminal 81b) under the off-state in which the fixed connection point 81 is not touching the movable connection point 83, the risk of giving an electrical shock to a user holding the coupling cable 60 or the shorting bar 61 caused by a current leaking outside from the resistance unit can be reduced.

Moreover, since the inactive gas is filled in the case 87, the possibility of a spark occurring between the fixed connection point 81 and the movable connection point 83 under the off-state in which the fixed connection point 81 is not touching the movable connection point 83 (or immediately before the on-state) is low.

Figure 13:
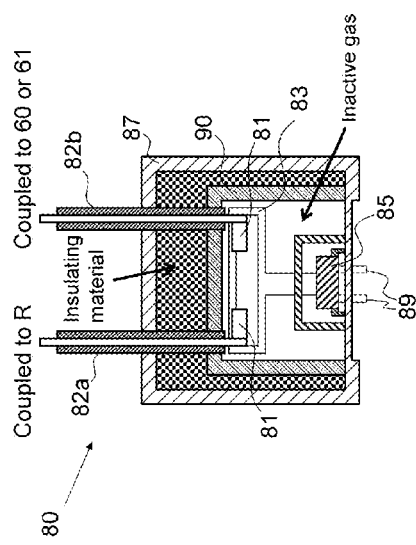
FIG. 13 is a sectional view illustrating a configuration of a switching device different from the configuration illustrated in FIG. 12.

Alternatively, cables (a first cable 82a and a second cable 82b) projecting outside the case 87 from the fixed connection point 81 may be provided in place of the first terminal 81a and the second terminal 81b (see FIG. 13).

An end of the first cable 82a is coupled to one of the fixed connection points 81, and the other end of the first cable 82a is coupled to the resistor R. An end of the second cable 82b is coupled to the other one of the fixed connection points 81, and the other end of the second cable 82b is coupled to the coupling cable 60 or the shorting bar 61.

Inside the case 87, the region where the first cable 82a makes contact with the fixed connection point 81, the region where the second cable 82b makes contact with the fixed connection point 81, and the region including the fixed connection point 81 and the movable connection point 83 are surrounded by a sealed container (internal case) 90. The inside of the sealed container 90 is filled with an inactive gas such as nitrogen. The region between the sealed container 90 and the case 87 at least including the region between the first cable 82a and the second cable 82b is filled with an insulating material such as butyl rubber to prevent a short circuit between the first cable 82a and the second cable 82b.

In FIG. 13, the entire region between the sealed container 90 and the case 87 is filled with an insulating material. The region filled with the insulating material is illustrated in a check pattern. The lead wire (control signal line) 86 (not shown in FIG. 13) composed of a multi-core cable is connected to a control terminal 89 extending from the driving member 85 at the bottom of the case 87.

The first cable 82a and one of the fixed connection points 81 as well as the second cable 82b and the other fixed connection point 81 may be provided separately as in FIG. 13 or integrated so as distal ends of the first cable 82a and the second cable 82b to function as the fixed connection points 81 that make contact with the movable connection point 83.

The wiring between the power source connector 40 and each resistance unit will now be described. Each of the resistor-group of the first resistance unit 21 (the 11th resistor-group R11 to the 18th resistor-group R18), the resistor-group of the third resistance unit 23 (the 31st resistor-group R31 to the 38th resistor-group R38), and the resistor-group of the fifth resistance unit 25 (the 51st resistor-group R51 to the 58th resistor-group R58) is coupled to the power source connector 40 via the coupling switch unit 70 attached to the frame (the first frame 21a, the third frame 23a, and the fifth frame 25a) of each resistance unit.

The coupling switch unit 70 includes the main body 71, the first bus bar 73, an attachment part 75, a second bus bar 77, and the first switching unit SW1 to the eighth switching unit SW8.

The main body 71 has a square-C-shape or C-shape cross section and extends in the z direction. In exemplary embodiment, the main body 71 has a square-C-shape cross section and is configured with an intermediate part 71a having a face parallel with the back face of the resistance unit, a first side part 71b1, and a second side part 71b2, the first side part 71b1 and the second side part 71b2 each extending from the edge of the intermediate part 71a and having a face parallel with the side face of the resistance unit. The intermediate part 71a, the first side part 71b1, and the second side part 71b2 together forms the square-C-shape or C-shape cross section.

Even when the main body 71 is formed of a conductive material such as a stainless steel, a load test current does not flow in the main body 71 because the main body 71 is separated via the insulator 50 or the like from the first bus bar 73 or the first switching unit SW1 to the eighth switching unit SW8 in which a load test current flows. When the main body 71 is formed of a conductive material such as a stainless steel, it is desirable to provide grounding through an earth line extending from, for example, the first side part 71b1 to protect the internal control signal line (see FIG. 17).

The insulator 50 extending in the y direction is provided at two or more locations on the outer side of the intermediate part 71a (a first face). The first switching unit SW1 to the eighth switching unit SW8 each having a sleeve part extending in the y direction are provided between the insulators 50.

The control signal lines of the first switching unit SW1 to the eighth switching unit SW8 are contained in the inner side of the intermediate part 71a.

A cover 71c formed of a transparent material such as polycarbonate facing the inner side of the intermediate part 71a is desirably provided so that the control signal lines can be viewed from outside.

The cover 71c and the second side part 71b2 may be integrated to provide the second side part 71b2 formed of a transparent material such as polycarbonate. In this case, the intermediate part 71a and the first side part 71b1 are integrated.

A lid 71d is desirably provided on the top of the main body 71 to prevent intrusion of water or the like. The lid 71d is omitted in the drawings other than FIGS. 17 and 22.

The insulator 50 extending in the x direction is provided at two or more locations on the first side part 71b1 (a second face perpendicular to the first face). The second side part 71b2 faces the side face of the resistance unit (the first resistance unit 21, the third resistance unit 23, or the fifth resistance unit 25) without making contact.

The coupling switch unit 70 is attached to the resistance unit (the first resistance unit 21, the third resistance unit 23, and the fifth resistance unit 25) with the intermediate part 71a and the first side part 71b1 disposed in a manner that the switching unit is positioned between the first bus bar 73 and the terminal of the resistor R which is coupled to the switching unit via the cable.

The first bus bar 73 is a copper-made conductive member extending in the z direction attached to (the first side part 71b1 of) the main body 71 via the insulator 50 extending in the x direction with a certain gap (the second distance d2) therebetween. One of the power source lines (a U-phase line LU, a V-phase line LV, and a W-phase line LW) from the power source to be tested is coupled to the first bus bar 73.

The first bus bar 73 of the coupling switch unit 70 attached to the first resistance unit 21 is coupled to the U-phase line LU. The U-phase line LU is coupled via the vacuum circuit breaker 41 to an R-phase terminal of the power source to be tested.

The first bus bar 73 of the coupling switch unit 70 attached to the third resistance unit 23 is coupled to the V-phase line LV. The V-phase line LV is coupled via the vacuum circuit breaker 41 to an S-phase terminal of the power source to be tested.

The first bus bar 73 of the coupling switch unit 70 attached to the fifth resistance unit 25 is coupled to the W-phase line LW. The W-phase line LW is coupled via the vacuum circuit breaker 41 to a T-phase terminal of the power source to be tested.

The attachment part 75 is made of a stainless steel, has an L-shape or square-C-shape cross section, and extends in the x direction. The attachment part 75 couples the insulator 50, extending in the y direction, attached to the back face (the intermediate part 71a) of the main body 71 and couples the back face of the frame (the first frame 21a, the third frame 23a, and the fifth frame 25a) of the resistance unit, to attach the coupling switch unit 70 to the resistance unit (the first resistance unit 21, the third resistance unit 23, and the fifth resistance unit 25).

The first switching unit SW1 has the same configuration as the switching device 80 illustrated in FIG. 13. One of the terminals is coupled to the first bus bar 73 via a cable, and the other terminal is coupled to the resistor R of the uppermost resistor-group (the 11th resistor-group R11, the 31st resistor-group R31, or the 51st resistor-group R51) via a cable.

The second switching unit SW2 has the same configuration as the switching device 80 illustrated in FIG. 13. One of the terminals is coupled to the first bus bar 73 via a cable, and the other terminal is coupled to the resistor R of the second uppermost resistor-group (the 12th resistor-group R12, the 32nd resistor-group R32, or the 52nd resistor-group R52) via a cable.

The third switching unit SW3 has the same configuration as the switching device 80 illustrated in FIG. 13. One of the terminals is coupled to the first bus bar 73 via a cable, and the other terminal is coupled to the resistor R of the third uppermost resistor-group (the 13th resistor-group R13, the 33rd resistor-group R33, or the 53rd resistor-group R53) via a cable.

The fourth switching unit SW4 has the same configuration as the switching device 80 illustrated in FIG. 13. One of the terminals is coupled to the first bus bar 73 via a cable, and the other terminal is coupled to the resistor R of the fourth uppermost resistor-group (the 14th resistor-group R14, the 34th resistor-group R34, or the 54th resistor-group R54) via a cable.

The fifth switching unit SW5 has the same configuration as the switching device 80 illustrated in FIG. 13. One of the terminals is coupled to the first bus bar 73 via a cable, and the other terminal is coupled to the resistor R of the fifth uppermost resistor-group (the 15th resistor-group R15, the 35th resistor-group R35, or the 55th resistor-group R55) via a cable.

The sixth switching unit SW6 has the same configuration as the switching device 80 illustrated in FIG. 13. One of the terminals is coupled to the first bus bar 73 via a cable, and the other terminal is coupled to the resistor R of the sixth uppermost resistor-group (the 16th resistor-group R16, the 36th resistor-group R36, or the 56th resistor-group R56) via a cable.

The seventh switching unit SW7 has the same configuration as the switching device 80 illustrated in FIG. 13. One of the terminals is coupled to the first bus bar 73 via a cable, and the other terminal is coupled to the resistor R of the seventh uppermost resistor-group (the 17th resistor-group R17, the 37th resistor-group R37, or the 57th resistor-group R57) via a cable.

The eighth switching unit SW8 has the same configuration as the switching device 80 illustrated in FIG. 13. One of the terminals is coupled to the first bus bar 73 via a cable, and the other terminal is coupled to the resistor R of the eighth uppermost resistor-group (the 18th resistor-group R18, the 38th resistor-group R38, or the 58th resistor-group R58) via a cable.

The coupling via a cable between the switching unit and the first bus bar 73 as well as between the switching unit and the resistor R may be made using the cable attached to the fixed connection point included in the switching device 80 (the first cable 82a coupled to the first bus bar 73 or the second cable 82b coupled to the resistor) as illustrated in FIG. 13, or alternatively, using a cable connected to a terminal provided on the fixed connection point.

The control signal lines (corresponding to the lead wire 86 of the switching device 80) of the first switching unit SW1 to the eighth switching unit SW8 are coupled to the controlling device 43 of the power source connector 40 through a region surrounded by the intermediate part 71a, the first side part 71b1, the second side part 71b2, and the cover 71c.

The switching unit (the first switching unit SW1 to the eighth switching unit SW8), the cable coupling the switching unit and the resistor, and the cable coupling the switching unit and the first bus bar 73 are provided outside the region surrounded by the intermediate part 71a, the first side part 71b, the second side part 71b2, and the cover 71c.

Figure 19:
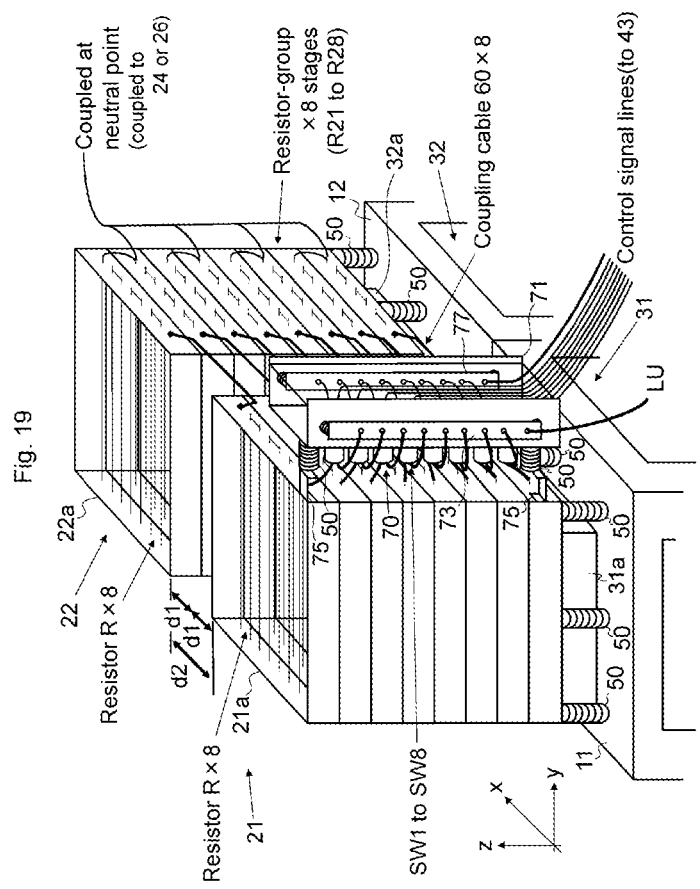
FIG. 19 is a perspective view illustrating a configuration of the first and second resistance units, the insulators, and the first and second base parts, where the coupling switch unit is attached to the rear of the first resistance unit.
Figure 20:
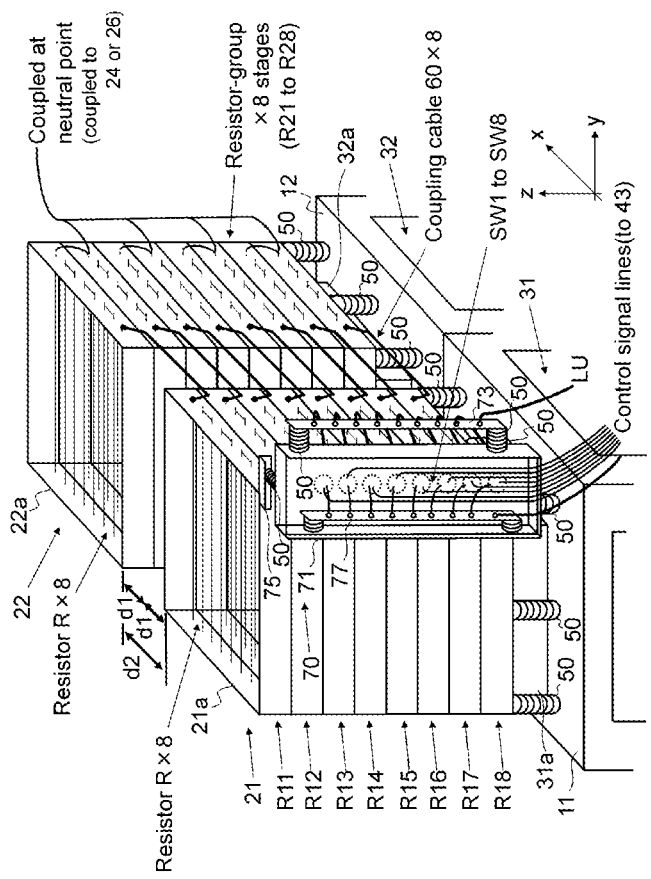
FIG. 20 is a perspective view illustrating a configuration of the first and second resistance units, the insulators, and the first and second base parts, where the coupling switch unit is attached to the first resistance unit with the intermediate part being parallel with a side face of the resistance unit.
Figure 21:
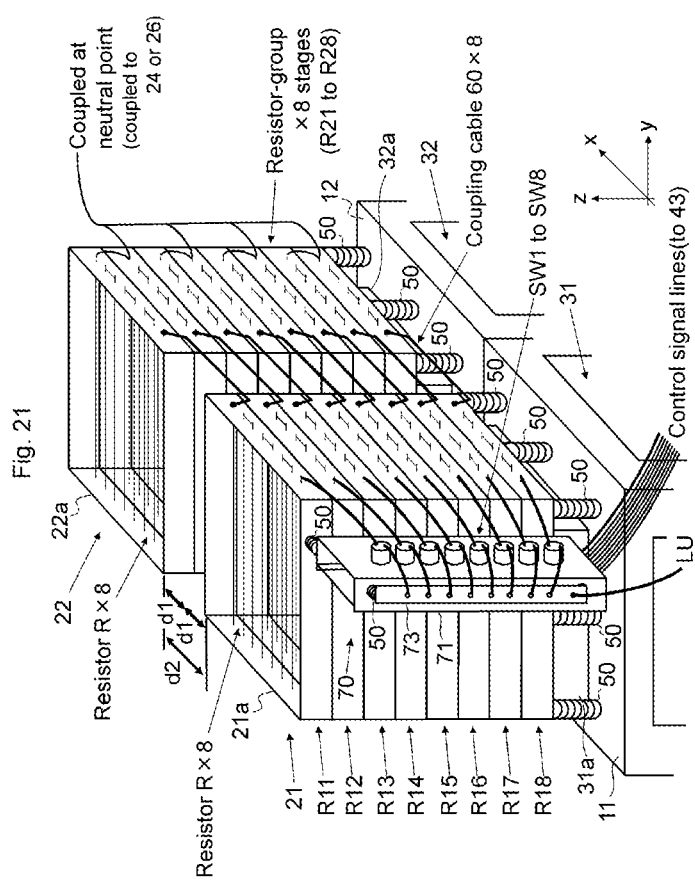
FIG. 21 is a perspective view illustrating a configuration of the first and second resistance units, the insulators, and the first and second base parts, where the coupling switch unit is attached to the first resistance unit by using the insulator extending in the x direction provided on the second side part.

The lead wires 86 constituting the control signal line include two wires, that is, a plus wire and a minus wire. Plus wires (eight wires corresponding to the first switching unit SW1 to the eighth switching unit SW8) are all coupled to the controlling device 43. Minus wires (eight wires corresponding to the first switching unit SW1 to the eighth switching unit SW8) are coupled to the second bus bar 77 formed of a copper-made conductive material extending in the z direction provided in the main body 71 via the insulator. One minus wire is connected to the controlling device 43 via the second bus bar 77. In the embodiment as described above, the eight plus wires corresponding to the first switching unit SW1 to the eighth switching unit SW8 and one minus wire are provided as the control signal lines wired between each coupling switch unit 70 and the controlling device 43. The second bus bar 77 is illustrated in FIGS. 19 and 20 in which the inside of the coupling switch unit 70 is visible.

Figure 17:
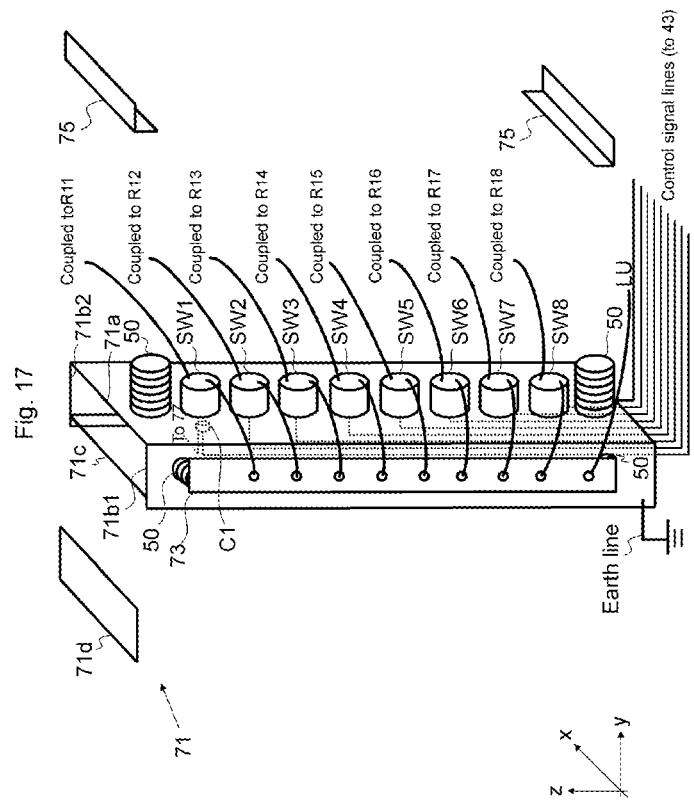
FIG. 17 is a perspective view of the coupling switch unit.
Figure 18:
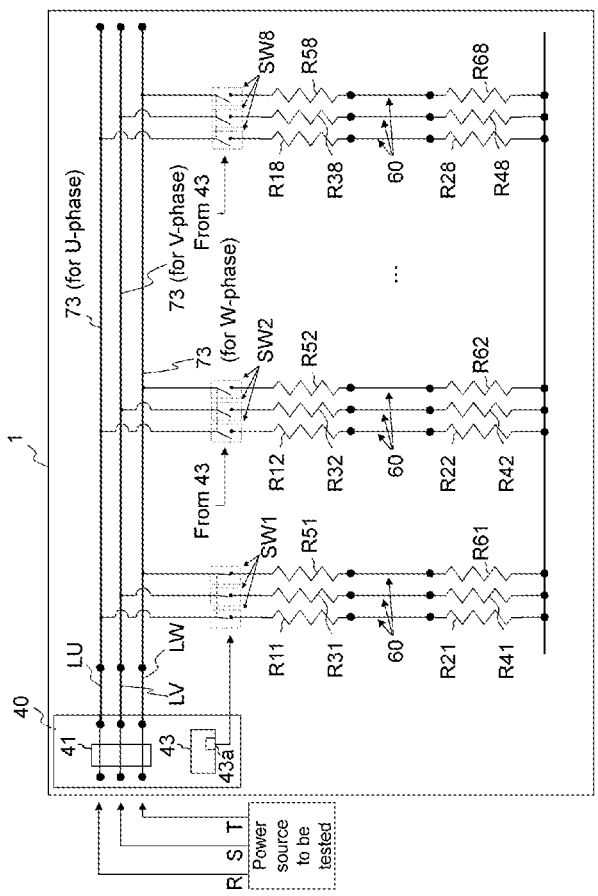
FIG. 18 is a schematic view of a circuit configuration of the load testing apparatus.

The cables of the control signal lines (plus wires and a minus wire) may be directly coupled to the switching unit. Desirably, the cables of the control signal lines may be coupled to the switching unit via a first connector C1 provided in the vicinity of each switching unit to make attaching and detaching easy. FIG. 17 illustrates the portion corresponding to the control terminal 89 of the first switching unit SW1 coupled to the control signal line via the first connector C1 (first connectors C1 for the second switching unit SW2 to the eighth switching unit SW8 are omitted in the drawing).

Figure 22:
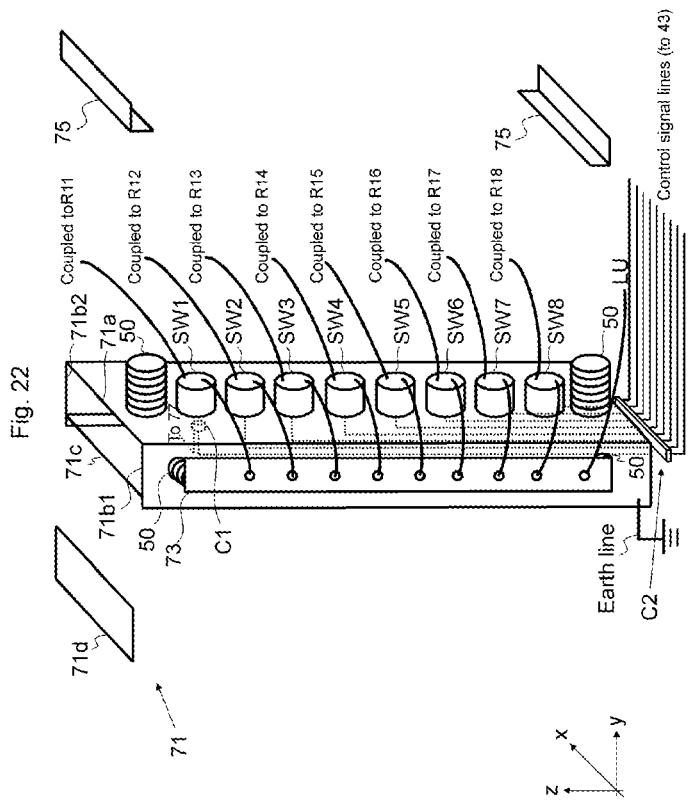
FIG. 22 is a perspective view of the coupling switch unit with control signal lines coupled by using a second connector.

As illustrated in FIG. 22, it may be configured that a second connector C2 connected to a plurality of control signal lines (the eight plus wires corresponding to the first switching unit SW1 to the eighth switching unit SW8 and the minus wire) is provided outside the coupling switch unit 70 to be coupled to the coupling switch unit 70 (cables inside the coupling switch unit 70) so that the second connector C2 is coupled to the first switching unit SW1 to the eighth switching unit SW8. This configuration eases wiring of the coupling switch unit 70 and the control signal lines and replacement of the whole coupling switch unit 70 when a malfunction occurs in any of the switching units.

In response to an operation related to a load instructed through the operating unit provided in the power source connector 40, the controlling device 43 controls on and off of the switching devices (the first switching unit SW1 to the eighth switching unit SW8) of the coupling switch units 70 attached to the first resistance unit 21, the third resistance unit 23, and the fifth resistance unit 25 via the control signal lines to control switching of the resistor-groups used for a load test.

Desirably, control relays (eight control relays corresponding to the first switching unit SW1 to the eighth switching unit SW8) 43a are provided to the controlling device 43 so that the controlling device 43 controls on and off of the switching devices (the first switching unit SW1 to the eighth switching unit SW8) via the control relays 43a.

Figure 14:
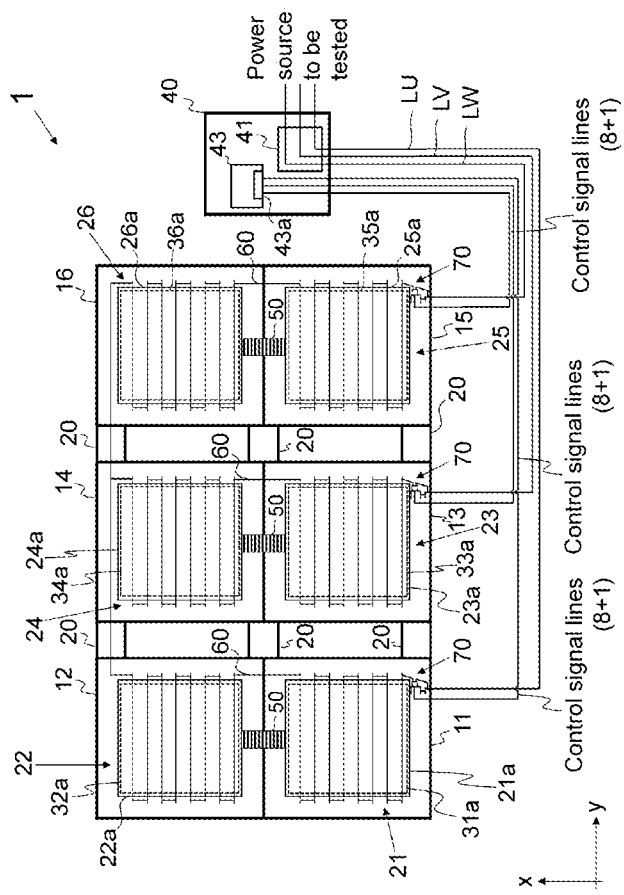
FIG. 14 is a top view of the dry load testing apparatus according to the embodiment where the base parts are adjoined to the adjacent base parts, with illustration of wirings between a power source connector and the resistance units.
Figure 15:
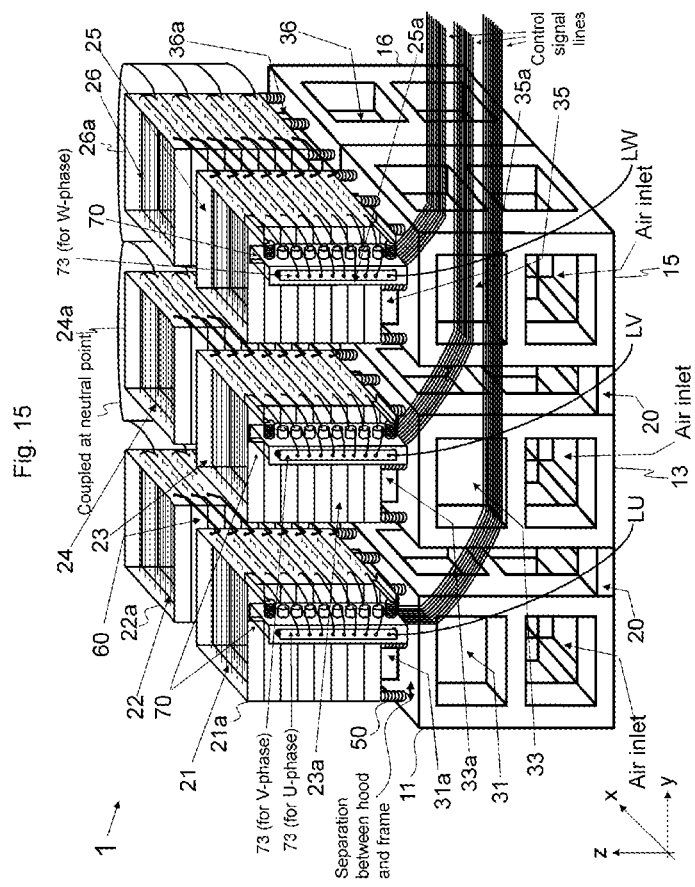
FIG. 15 is a perspective view illustrating a configuration of the first to sixth resistance units, the first to sixth base parts, the insulators, the first to sixth cooling fans, and the coupling switch units, where the coupling switch unit is attached to the first resistance unit, the third resistance unit, and the fifth resistance unit.
Figure 16:
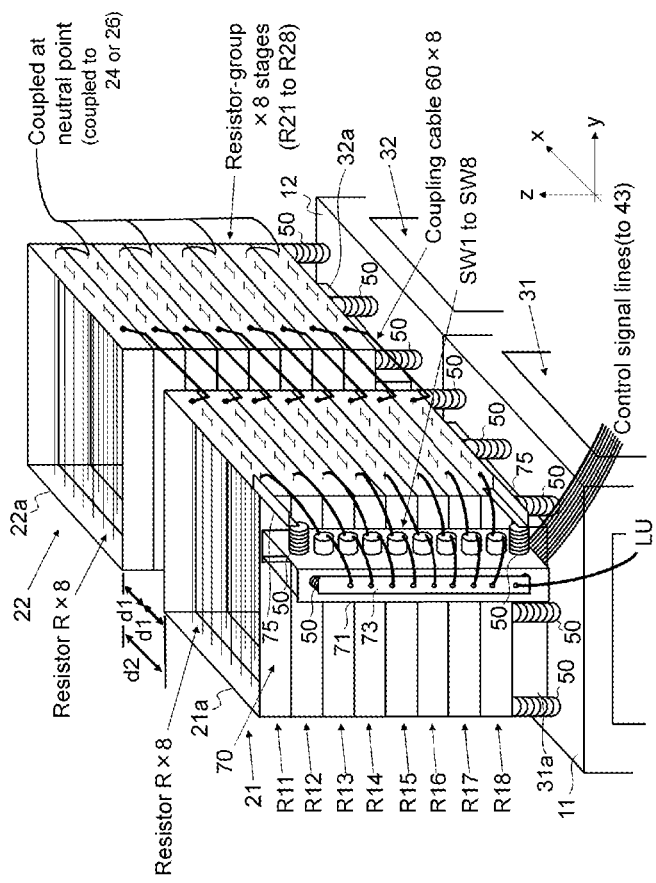
FIG. 16 is a perspective view illustrating a configuration of the first and second resistance units, the insulators, and the first and second base parts, where the coupling switch unit is attached to a side of the first resistance unit.

In this case, as illustrated in FIGS. 14 and 15, plus wires (three sets of eight plus wires each, namely, total of 24 plus wires) of the control signal lines from the switching units are distributed by a set of three plus wires to each of the eight control relays 43a provided on the controlling device 43. Minus wires (three sets of a single minus wire each, namely, total of three minus wires) of the control signal lines from the coupling switch units 70 are each branched to be connected to eight control relays 43a. The minus wires may be branched to be distributed to the eight control relays 43a using another bus bar (not shown) provided in the vicinity of the controlling device 43.

Although, in this configuration, wiring around the controlling device 43 (the eighth work step, which will be described later) is complicated compared to the configuration in which the control signal lines coupled to the n-th switching unit SWn (n takes the number from 1 to 8) of the resistance units (the first resistance unit 21, the third resistance unit 23, and the fifth resistance unit 25) are shorted and only the control signal lines including eight plus wires and one minus wire are coupled to the controlling device 43 (see FIGS. 23 and 24), the control circuit is protected when a malfunction occurs in any one of the switching units and thus advantageously reduces an effect to other switching units (prevents damage to other switching units).

Figure 23:
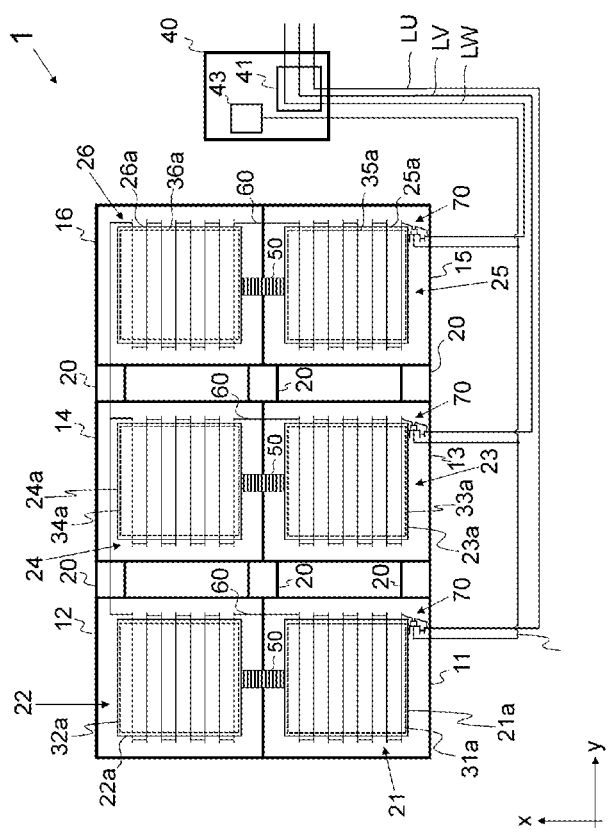
FIG. 23 is a top view of an embodiment in which the control signal lines for the switching units corresponding to the resistor-groups in the same stage are shorted and coupled to the controlling device, the view illustrating the wiring between the power source connector and the resistance units.
Figure 24:
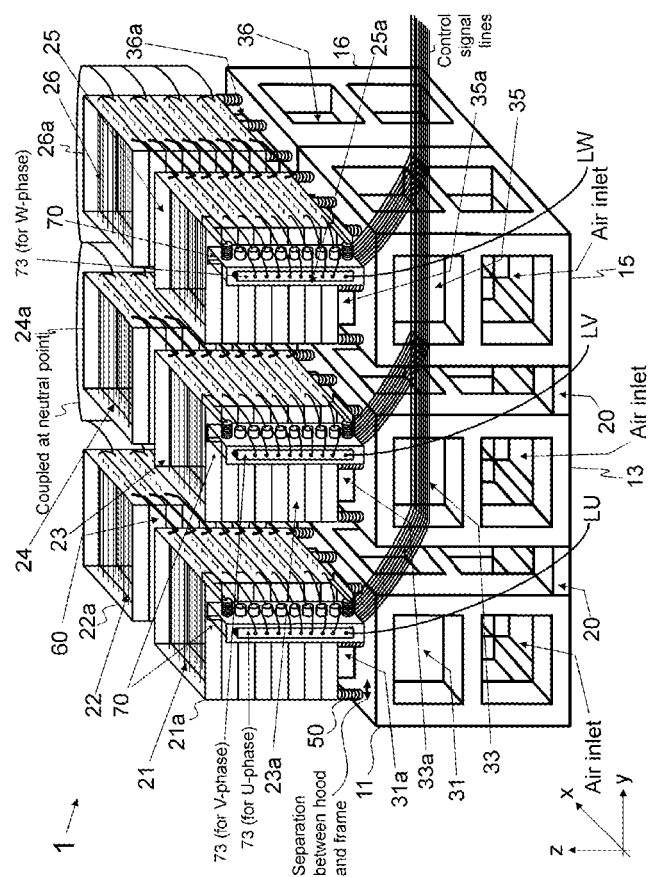
FIG. 24 is a perspective view of an embodiment in which the control signal lines for the switching units corresponding to the resistor-groups in the same stage are shorted and coupled to the controlling device, the view illustrating a configuration of the first resistance unit to the sixth resistance unit, the first base part to the sixth base part, the insulators, the first cooling fan to the sixth cooling fan, and the coupling switch units.

In the configurations illustrated in FIGS. 14 and 15 or in FIGS. 23 and 24, the n-th switching units SWn (n takes the number from 1 to 8) of the coupling switch units 70 attached to the first resistance unit 21, the third resistance unit 23, and the fifth resistance unit 25 are controlled to be set on or off at a same timing.

For example, when the first switching unit SW1 of the coupling switch unit 70 attached to the first resistance unit 21 is set to the on-state, the first switching units SW1 of the coupling switch units 70 attached to the third resistance unit 23 and the fifth resistance unit 25 are also set to the on-state. In this state, electric power is supplied to the 11th resistor-group R11 and the 21st resistor-group R21 from the R-phase of the power source to be tested, electric power is supplied to the 31st resistor-group R31 and the 41st resistor-group R41 from the S-phase of the power source to be tested, and electric power is supplied to the 51st resistor-group R51 and the 61st resistor-group R61 from the T-phase of the power source to be tested (see FIG. 18).

Wiring of the load testing apparatus 1 can be completed by: coupling resistor-groups of three resistance units (the second resistance unit 22, fourth resistance unit 24, and the sixth resistance unit 26) at neutral points (the first work step); coupling resistor-groups of resistance units adjacent in x direction (for example, the resistor-group of the first resistance unit 21 and the resistor-group of the second resistance unit 22) via the coupling cable 60 (the second work step); attaching the coupling switch unit 70 to each of three resistance units (the first resistance unit 21, the third resistance unit 23, and the fifth resistance unit 25) (the third work step); coupling the switching unit and the resistor-group via the cable (the fourth work step); wiring the U-phase line LU between the power source connector 40 and the first bus bar 73 of the coupling switch unit 70 attached to the first resistance unit 21 (the fifth work step); wiring the V-phase line LV between the power source connector 40 and the first bus bar 73 of the coupling switch unit 70 attached to the third resistance unit 23 (the sixth work step); wiring the W-phase line LW between the power source connector 40 and the first bus bar 73 of the coupling switch unit 70 attached to the fifth resistance unit 25 (the seventh work step); and wiring the control signal lines of the switching units between the power source connector 40 and three coupling switch units 70 (the eighth work step).

The attaching of resistors R in the resistance unit and coupling of the switching unit and the first bus bar 73 in the coupling switch unit 70 via the cable can previously be completed before transporting the components to the site where the load testing apparatus 1 is set up. Thus after positioning the resistance unit mounted on the base part at a predetermined place, the first work step to the eighth work step are conducted using the coupling switch unit 70 including the first bus bar 73 and the switching unit. In this manner, wiring of components constituting the load testing apparatus 1 can efficiently be conducted.

In particular, since the coupling switch unit 70 is attached to the resistance unit so as the switching unit to be positioned between the first bus bar 73 and the terminal of the resistor R which is coupled to the switching unit via the cable, the resistor-group and the switching unit as well as the switching unit and the first bus bar 73 can be coupled using a short coupling member (e.g., a cable).

When the elevating machine has dimensions allowing the resistance unit with the coupling switch unit 70 attached thereto and the base part to be carried therein, that is, when the total dimensions (width, height, and depth) of a set consisting of the base part, the resistance unit with the coupling switch unit 70, and the cooling fan are smaller than the entrance width, the height, and the depth of the elevating machine, the third work step and the fourth work step can also be previously conducted before transporting the components to the site where the load testing apparatus 1 is set up.

Such configuration advantageously simplifies the wiring compared to the configuration in which the resistor-groups of the resistance units are coupled to the power source connector 40 via cables without using the coupling switch units 70 and the switching device provided in the power source connector 40 performs switching control of the resistor-groups to be used, because the number of cables used for coupling the resistance units and the power source connector 40 is reduced by using the coupling switch unit 70.

The first switching unit SW1 to the eighth switching unit SW8 provided in the coupling switch unit 70 might be damaged by frequently setting on and off even when each switching unit is configured as a durable switching device filled inside with an inactive gas. The maintenance of the embodiment is easy because the switching unit, which is likely to be damaged than other components, is provided in the coupling switch unit 70.

Moreover, since the intermediate part 71*a* of the coupling switch unit 70 is positioned between the first side part 71*b*1 of the main body 71 and the side face of the resistance unit, and the switching unit is attached to the intermediate part 71*a*, a space for maintenance, such as replacement and repair of a switching unit, can easily be secured.

Furthermore, since the main body 71 of the coupling switch unit 70 is detachably attached to the resistance unit via the insulator 50 or the attachment part 75, the coupling switch unit 70 including a damaged switching unit can easily be replaced with a new coupling switch unit 70 to be repaired.

The coupling switch unit 70 may be attached to the side of the resistance unit. Alternatively, if there is a space to position the coupling switch unit 70 between resistance units adjacent in the y direction, the coupling switch unit 70 may be attached to the front or the rear of the resistance unit (see FIG. 19).

In the described embodiment, the coupling switch unit 70 is attached to the resistance unit in the positional relationship that the first face (the intermediate part 71*a*) to which the switching unit is attached is parallel with the back face of the resistance unit and the second face (the first side part 71*b*1) to which the first bus bar 73 is attached is parallel with the side face of the resistance unit. Alternatively, in another embodiment, the coupling switch unit 70 may be attached to the resistance unit in the positional relationship that the first face (intermediate part 71*a*) is parallel with the side face of the resistance unit and the second face (the first side part 71*b*) to which the first bus bar 73 is attached is parallel with the back face of the resistance unit, with maintaining the positional relationship that the switching unit is positioned between the first bus bar 73 and the terminal of the resistor R which is coupled to the switching unit via a cable (see FIG. 20).

In the described embodiment, the coupling switch unit 70 is attached to the resistance unit using the insulator 50 extending in the y direction and the attachment part 75. Alternatively, in another embodiment, the coupling switch unit 70 may be attached to the resistance unit using the insulator 50 extending in the x direction provided on the second side part 71*b*2 (see FIG. 21).

An effect of the present invention (for example, easy to be transported and set up) can be obtained not only by a load testing apparatus including three assemblies each of two resistance units, that is, total six resistance units, but by a load testing apparatus including two resistance units.

In the described embodiments illustrated in FIGS. 1 to 24, the resistance unit (a resistance unit having an air inlet and an exhaust outlet both opening in the vertical direction) is positioned above the cooling fan that takes in air through the bottom face and sends cooling air through the top face. Alternatively, in another embodiment, a resistance unit (a resistance unit having an air inlet and an exhaust outlet both opening in the horizontal direction) may be attached via insulators 50 to the front of a cooling fan that exhausts air in the horizontal direction to send cooling air from the rear to the front (see FIG. 25).

Figure 25:
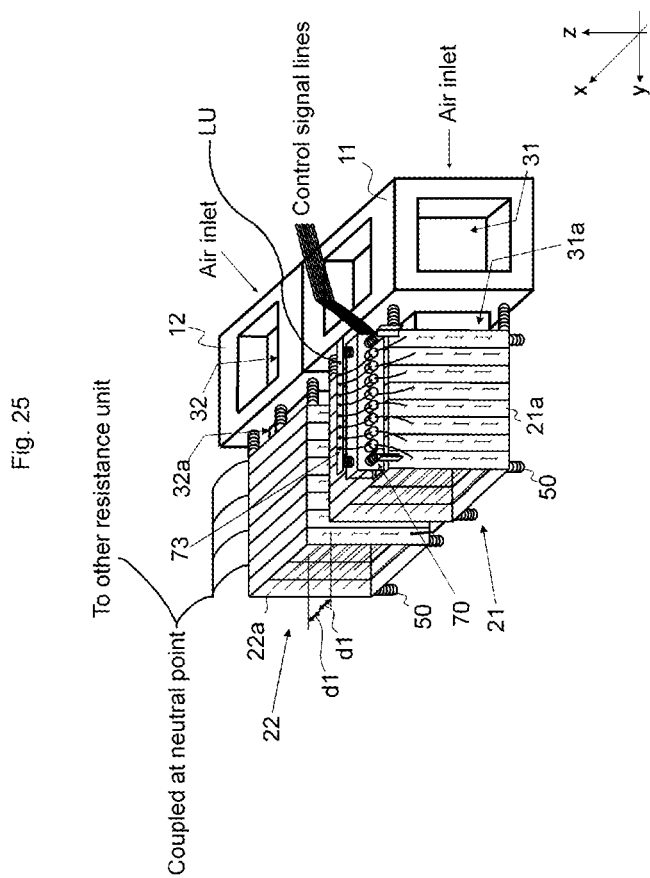
FIG. 25 is a perspective view of an embodiment in which cooling fans are disposed beside the resistance units each configured with horizontally arranged resistor-groups, the view illustrating a configuration of the first and second resistance units, the insulators, and the first and second base parts.

FIG. 25 illustrates two resistance units (the first resistance unit 21 and the second resistance unit 22) positioned beside two base parts (a first base part (a first cooling part) 11 and a second base part (a second cooling part) 12) (illustration of other resistance units coupled via neutral points is omitted).

In the embodiments illustrated in FIGS. 25 and 26, description will be made with directions defined such that a horizontal direction along which the first base part (the first cooling part) 11 and the second base part (the second cooling part) 12 are disposed is x direction, a horizontal direction along which the first base part 11 and the first resistance unit 21 are disposed is y direction, and the direction perpendicular to both the y and x directions is z direction.

In the embodiment illustrated in FIGS. 25 and 26 which will be described below, the resistor R extends in the horizontal direction (to be parallel with the x direction). Alternatively, in another embodiment, the resistor R may be positioned to extend in the vertical direction (to be parallel with the z direction).

Insulators 50 are desirably provided between the resistance unit and a positioning face to support the resistance unit.

Since the cooling fan can take in air from the back face, the air inlet in the side face of the base part (cooling part) can be eliminated.

When the resistance unit and the cooling fan are laterally positioned, hot air is exhausted in the lateral direction. Thus it is desirable to provide a duct for exhausting hot air upward by changing the direction of the exhaust air from the lateral direction to the upward direction (the duct having a horizontally opened air inlet and a vertically opened exhaust outlet to exhaust air upward) on the supply air passage in the downstream from the resistance unit, and to detachably couple the resistance unit and the duct with the exhaust outlet of the resistance unit facing the air inlet of the duct (see FIG. 26).

Figure 26:
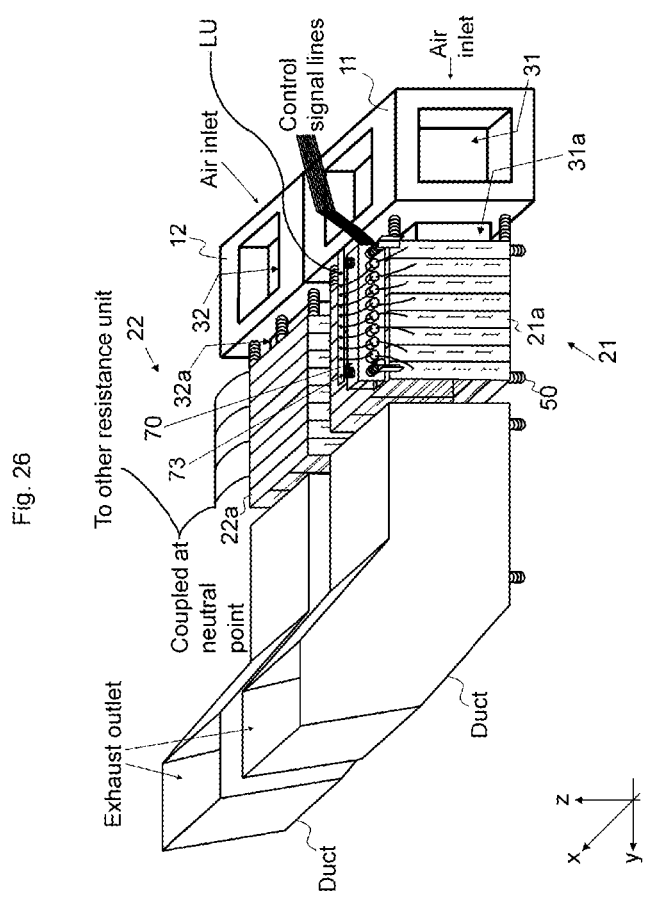
FIG. 26 is a perspective view of the configuration illustrated in FIG. 25 provided with ducts.

In FIG. 26, the duct is illustrated to be separated from the resistance unit to show the internal structure. In an actual operation (when conducting a load test), the air inlet of the duct and the exhaust outlet of the resistance unit are closely positioned to prevent leaking out of hot air.

Figure 27:
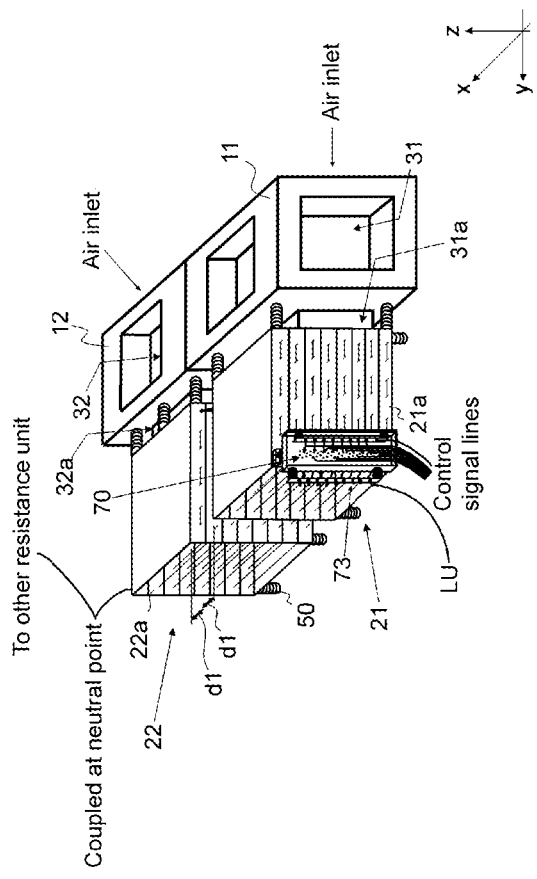
FIG. 27 is a perspective view of an embodiment in which cooling fans are disposed beside the resistance units configured with vertical arranged resistor-groups, the view illustrating a configuration of the first and second resistance units, the insulators, and the first and second base parts.

Each resistance unit may be configured with resistor-groups arranged in the y direction (horizontal direction), where each resistor-group includes resistors R arrayed along the z direction (vertical direction), each resistor R being parallel with the x direction (see FIGS. 25 and 26). Alternatively, resistor-groups may be arranged in the z direction (vertical direction), where each resistor-group includes resistors R arrayed along the y direction (horizontal direction), each resistor R being parallel with the x direction (see FIG. 27). In any of the cases, the load condition of the power source to be tested is changed by switching the resistor-groups to be used.

In any of the cases, the face of the frame of the resistance unit (the face forming the outer profile of the resistance unit, but not the front face nor the back face including the air inlet or the exhaust outlet) that at least faces the adjacent resistance unit is positioned in the inner side of the side face (face forming the outer profile of the cooling part, but not the front face nor the back face including the air inlet or the exhaust outlet) of the base part (cooling part) by the first distance d1.

In any of the cases, the coupling switch unit 70 is attached to the resistance unit in the positional relationship that the switching unit is positioned between the first bus bar 73 and the terminal of the resistor R which is coupled to the switching unit via the cable.

In any of the cases, transportation may be conducted with the resistance unit mounted on the base part (cooling part) (vertically turned position of FIGS. 25 to 27) considering the internal space of the elevating machine.

REFERENCE SIGNS LIST 1 dry load testing apparatus
11 to 19 first base part to ninth base part
20 gap adjusting member
21 to 26 first resistance unit to sixth resistance unit
21a to 26a first frame to sixth frame
31 to 36 first cooling fan to sixth cooling fan
31a to 36a first hood to sixth hood
40 power source connector
41 vacuum circuit breaker
43 controlling device
43a control relay
50 insulator
60 coupling cable
61 shorting bar
70 coupling switch unit
71 main body
71a intermediate part
71b1, 71b2 first side part, second side part
71c cover
71d lid
73 first bus bar
75 attachment part
77 second bus bar
80 switching device
81 fixed connection point
81a, 81b first terminal, second terminal
82a, 82b first cable, second cable
83 movable connection point
85 driving member
86 lead wire
87 case
88 insulating wall
89 control terminal
90 sealed container (internal case)
C1, C2 first connector, second connector
d1 to d3 first distance to third distance
SW1 to SW8 first switching unit to eighth switching unit

The invention claimed is:
1. A load testing apparatus comprising:
at least two resistance units each configured with a plurality of resistor-groups arranged in stages along z direction, which is a vertical direction, and including a frame configured with an insulating material covering a side face of the resistor-groups, each of the resistor-groups including resistors arrayed along a horizontal direction; and
at least two base parts each including a cooling fan and provided separately, wherein
at least one of the resistance units are provided on a top of each of the base parts via an insulator,
a face of the frame that at least faces another adjacent resistance unit is positioned in an inner side of a side face of the base part, on which the resistance unit is provided, by a first distance when viewed from above,
the at least two resistance units are disposed to have a gap between the frames of adjacent resistance units, the gap being equal to or larger than a second distance to provide insulation between the adjacent resistance units,
the second distance is twice the first distance, and
the first distance is equal to or larger than 45 mm.
2. The load testing apparatus according to claim 1, wherein
the resistance units are first to sixth resistance units,
the cooling fans are first to sixth cooling fans,
the base parts are first to sixth base parts,
the first base part includes the first cooling fan, the first resistance unit being disposed on a top of the first base part via the insulator,
the second base part includes the second cooling fan, the second resistance unit being disposed on a top of the second base part via the insulator,
the third base part includes the third cooling fan, the third resistance unit being disposed on a top of the third base part via the insulator,
the fourth base part includes the fourth cooling fan, the fourth resistance unit being disposed on a top of the fourth base part via the insulator,
the fifth base part includes the fifth cooling fan, the fifth resistance unit being disposed on a top of the fifth base part via the insulator,
the sixth base part includes the sixth cooling fan, the sixth resistance unit being disposed on a top of the sixth base part via the insulator,
the first base part, the third base part, and the fifth base part are separable from each other,
the second base part, the fourth base part, and the sixth base part are separable from each other,
the first resistance unit and the second resistance unit are disposed along x direction perpendicular to the z direction with a gap equal to or larger than the second distance,
the third resistance unit and the fourth resistance unit are disposed along the x direction with a gap equal to or larger than the second distance,
the fifth resistance unit and the sixth resistance unit are disposed along the x direction with a gap equal to or larger than the second distance,
the first resistance unit, the third resistance unit, and the fifth resistance unit are disposed along y direction perpendicular to both the x direction and the z direction with a gap equal to or larger than a third distance larger than the second distance, and
the second resistance unit, the fourth resistance unit, and the sixth resistance unit are disposed along the y direction with a gap equal to or larger than the third distance.
3. The load testing apparatus according to claim 2, wherein
the first base part and the second base part are integrated,
the third base part and the fourth base part are integrated, and
the fifth base part and the sixth base part are integrated.

4. The load testing apparatus according to claim 2, wherein
the resistor-group is configured with a plurality of bar resistors each extending in the y direction arrayed along the x direction,
a gap adjusting member is provided between the first base part and the third base part, the second base part and the fourth base part, the third base part and the fifth base part, and the fourth base part and the sixth base part,
a width of the gap adjusting member in the y direction is larger than the second distance,
the third distance is a sum of twice the first distance and the width of the gap adjusting member in the y direction, and
a projecting length of a terminal of the resistor projecting from the frame covering a side face of the resistor-group is smaller than the first distance.

5. The load testing apparatus according to claim 2, further comprising
a coupling cable or a shorting bar, wherein
the coupling cable or the shorting bar is a coupling member used for detachably coupling, in a serial manner, adjacent resistor-groups of two resistance units adjacent along the x direction with a gap equal to or larger than the second distance, at least two couplings being provided between the resistor-groups adjacent along the x direction, and
the insulator has a size corresponding to a rated voltage of a power source when conducting a load test of the power source using a group of resistance units including serially connected resistor-groups of two resistance units adjacent along the x direction with a gap equal to or larger than the second distance.

6. The load testing apparatus according to claim 5, wherein
the coupling cable or the shorting bar is coupled to the resistor-group via a switching device including a case filled with an inactive gas, the case being embedded with a fixed connection point, a movable connection point, and a driving member that drives the movable connection point.

7. The load testing apparatus according to claim 5, further comprising
three coupling switch units, each of the three coupling switch units including a main body, a switching unit for controlling resistor-groups used for a load test among the plurality of resistor-groups, and a first bus bar coupled to a first terminal of the switching unit and one of power source lines from a power source subjected to the load test, wherein
a terminal of the resistor of the resistor-group is coupled to a second terminal of the switching unit,
the main body includes a first face and a second face vertical to the first face, the switching unit being attached to the first face, the first bus bar being attached to the second face via an insulator with a certain gap between the first bus bar and the second face, and
the three coupling switch units are detachably attached to the first resistance unit, the third resistance unit, and the fifth resistance unit so as each of the three switching units to be positioned between the first bus bar and the terminal of the resistor coupled to the switching unit via a coupling cable.

8. The load testing apparatus according to claim 2, wherein
a sleeve shaped hood is provided between the cooling fan and the resistance unit to introduce cooling air from the cooling fan to the resistance unit, the cooling fan being each of the first to sixth cooling fans, the resistance unit being each of the first to sixth resistance units, and
an upper portion of the sleeve shaped hood is positioned in an inner side of the frame covering a side face of the resistor-group with a gap of 10 mm or larger between the hood and the frame.

9. The load testing apparatus according to claim 1, wherein
the resistance units are a first resistance unit and a second resistance unit,
the cooling fans are a first cooling fan and a second cooling fan,
the base parts are a first base part and a second base part,
the first base part includes the first cooling fan, the first resistance unit being disposed on a top of the first base part,
the second base part includes the second cooling fan, the second resistance unit being disposed on a top of the second base part, and
the first resistance unit and the second resistance unit are disposed along x direction perpendicular to the z direction with a gap equal to or larger than the second distance.

10. A load testing apparatus comprising:
at least two resistance units each configured with a plurality of resistor-groups and including a frame configured with an insulating material covering a side face of the resistor-groups, each of the resistor-groups including an array of resistors; and
at least two cooling parts each including a cooling fan and provided separately, wherein
at least one of the resistance units is attached to each of the cooling parts via an insulator,
a face of the frame that at least faces another adjacent resistance unit is positioned in an inner side of a side face of the cooling part, to which the resistance unit is attached, by a first distance when viewed from above,
the at least two resistance units are disposed to have a gap between the frames of adjacent resistance units, the gap being equal to or larger than a second distance to provide insulation between the adjacent resistance units,
the second distance is twice the first distance, and
the first distance is equal to or larger than 45 mm.

11. The load testing apparatus according to claim 10, wherein
the resistance units are a first resistance unit and a second resistance unit,
the cooling fans are a first cooling fan and a second cooling fan,
the cooling parts are a first cooling part and a second cooling part,
the first cooling part includes the first cooling fan, the first resistance unit being attached to the first cooling part,
the second cooling part includes the second cooling fan, the second resistance unit being attached to the second cooling part, and
the first resistance unit and the second resistance unit are disposed with a gap equal to or larger than the second distance.

12. The load testing apparatus according to claim 10, wherein
the cooling fan exhausts air in a horizontal direction,
the resistance unit includes an air inlet opening in the horizontal direction and an exhaust outlet opening in the horizontal direction, and a duct including an air inlet opening in the horizontal direction and an exhaust outlet opening in a vertical direction provided in a downstream from the resistance unit is provided to exhaust air upward.

* * * * *